US007231337B1

(12) United States Patent
Karchmer et al.

(10) Patent No.: US 7,231,337 B1
(45) Date of Patent: *Jun. 12, 2007

(54) USING ASSIGNMENT DECISION DIAGRAMS WITH CONTROL NODES FOR SEQUENTIAL REVIEW DURING BEHAVIORAL SIMULATION

(75) Inventors: David Karchmer, Sunnyvale, CA (US); Daniel S. Stellenberg, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 569 days.

This patent is subject to a terminal disclaimer.

(21) Appl. No.: 10/776,684

(22) Filed: Feb. 10, 2004

Related U.S. Application Data

(63) Continuation of application No. 09/275,687, filed on Mar. 24, 1999, now Pat. No. 6,697,773.

(60) Provisional application No. 60/086,153, filed on May 19, 1998.

(51) Int. Cl.
*G06F 17/50* (2006.01)
*G06F 17/10* (2006.01)
*G06F 7/60* (2006.01)
*G01R 31/28* (2006.01)

(52) U.S. Cl. .............................. 703/15; 703/2; 703/16; 714/724; 714/725; 714/738; 714/741; 714/746; 716/1

(58) Field of Classification Search .................. 703/15, 703/16, 2; 714/37, 39, 47, 51, 724, 725, 714/741, 746, 747, 774, 811, 812; 702/57, 702/110; 716/1
See application file for complete search history.

(56) References Cited

U.S. PATENT DOCUMENTS

| 5,490,266 A | 2/1996 | Sturges |
| 5,513,118 A | 4/1996 | Dey et al. |
| 5,519,627 A | 5/1996 | Mahmood et al. |
| 5,623,418 A | 4/1997 | Rostoker et al. |
| 5,673,198 A | 9/1997 | Lawman et al. |
| 5,848,236 A | 12/1998 | Dearth et al. |
| 5,870,608 A | 2/1999 | Gregory |
| 5,920,711 A | 7/1999 | Searight et al. |
| 5,937,190 A | 8/1999 | Gregory et al. |

(Continued)

OTHER PUBLICATIONS

Gajski et al. "A design Methodology and Environment for Interactive Behavioral Synthesis", University of California, Irvine, 1996 pp. 1-21.

Kock, et al. Breakpoints and Breakpoint Detection in Source-Level Emulation, ACM, 1998, pp. 209-230.

(Continued)

*Primary Examiner*—Paul Rodriguez
*Assistant Examiner*—Dwin McTaggart Craig
(74) *Attorney, Agent, or Firm*—Beyer Weaver LLP

(57) ABSTRACT

The present invention provides a method and mechanism for simulating complex digital circuits using hybrid control and data flow representations. Specifically, the invention provides a method of simulating a digital circuit in such a way that the simulation is stopped at desired functions for subsequent analysis. A hardware design code describing the digital circuit is converted to an assignment decision diagram (ADD) representation that is then annotated with one or more control nodes that are used for maintaining control flow through a simulator. In this way, one or more break points are created that allow the simulator to stop at associated points in the simulation.

12 Claims, 27 Drawing Sheets

U.S. PATENT DOCUMENTS

| | | |
|---|---|---|
| 5,991,533 A | 11/1999 | Sano et al. |
| 6,044,211 A | 3/2000 | Jain |
| 6,173,241 B1 | 1/2001 | Trimberger |
| 6,212,650 B1 | 4/2001 | Guccione |
| 6,269,467 B1 | 7/2001 | Chang et al. |
| 6,317,860 B1 | 11/2001 | Heile |
| 6,421,808 B1 | 7/2002 | McGeer et al. |
| 6,697,773 B1 * | 2/2004 | Karchmer et al. ............ 703/15 |

OTHER PUBLICATIONS

Chaiyakul et al., "Assignment Decision Diagram for High-Level Synthesis", Dec. 12, 1992, Technical Report #92-103, Dept. of Information and Computer Science, University California, Irvince CA 92717.

Chaiyakul et al., "High-Level Transformation for Minimizing Syntactic Variances", ACM 1993, pp. 413-418.

* cited by examiner

PROCESS BLOCK 230

| | |
|---|---|
| 231 | Signal x:bit_vector (7 downto 0); process (x) |
| 232 | variable p : bit; |
| 233 | begin |
| 234 | p:='0'; |
| 235 | for I in 7 downto 0 loop |
| 236 | p:=p xor x(I); |
| 237 | end loop; |
| 238 | end process |

USING ASSIGNMENT DECISION DIAGRAMS WITH CONTROL NODES FOR SEQUENTIAL REVIEW DURING BEHAVIORAL SIMULATION

CROSS REFERENCE TO RELATED APPLICATION

This application is a continuation of U.S. patent application Ser. No. 09/275,687 filed Mar. 24, 1999, titled "Using Assignment Decision Diagrams with Control Nodes for Sequential Review During Behavioral Simulation, which issued as U.S. Pat. No. 6,697,773 on Feb. 24, 2004 and which is incorporated herein by reference in its entirety and for all purposes. This application also claims priority of provisional U.S. Patent Application No. 60/086,153, filed May 19, 1998, entitled "Behavioral Simulation Using A Hybrid Control and Data Flow Representation" and is related to U.S. patent application Ser. No. 09/275,527 filed Mar. 24, 1999, titled "Behavioral Digital Simulation Using Hybrid Control And Data Flow Representations" which issued as U.S. Pat. No. 6,961,690 on Nov. 1, 2005 and assigned to the assignee of the present application, which is hereby incorporated herein by reference for all purposes.

TECHNICAL FIELD OF THE INVENTION

This invention relates to computer aided design tools and techniques for the interactive design, implementation, and simulation of complex circuits and systems and more particularly, digital devices, modules, and systems.

BACKGROUND OF THE INVENTION

Present computer aided (CAD) systems for the design of electronic circuits, referred to as ECAD or electronic CAD systems, assist in the design of electronic circuits by providing a user with a set of software tools running on a digital computer. Typically, five major software program functions run on the ECAD system, a schematic editor, a compiler, a simulator, a verifier, and a layout program. The schematic editor program allows the user of the system to enter and/or modify a schematic diagram using the display screen, generating a net list (summary of connections between components) in the process. The compiler takes the net list as an input, and using a component data base puts all of the information necessary for layout, verification, and simulation into an object file or files. The verifier checks the schematic for design errors, such as multiple outputs connected together, overloaded signal paths, etc. And generates error indications if any such design problems exist. The simulator takes the schematic object file(s) and simulation models, and generates a set of simulation results, acting on instructions, initial conditions, and input signal values provided to it either in the form of a file or user input.

In order to simulate the performance of the circuit, it is necessary to run a simulator. A simulator is a software tool which operates on a digital representation, or simulation model, of a circuit, a list of input signals (stimuli) representing real inputs, and data about the performance characteristics of the represented circuit elements. The simulator then generates a numerical representation of the response of the circuit which can then be viewed either on a display screen in graphical form or as a list of values. Typically, the graphical representation is designed to produce an image similar to what one would see on an oscilloscope or logic analyzer screen monitoring a real circuit connected as described in the schematic diagram if the real inputs represented by the list in input signals were applied.

Simulation is often provided by utilizing simulation models at one or more of several different levels. Component level models attempt to describe the exact behavior of a specific component, such as a gate or transistor, when it is acted upon by a stimulus. Behavioral level models provide a simplified model of extremely complicated devices, such as microprocessors, or operational amplifiers. Such models, if simulated exactly on a transistor by transistor basis, would become prohibitive in terms of the size of their descriptions and the number of calculations and the amount of computing time required to completely simulate their function. In response, the behavioral model provides a logical or mathematical equation or set of equations describing the behavior of the component viewed as a "black box" also referred to as process blocks. Such models may either provide a very complete and accurate description of the performance of the modeled device, or a simple description of the types of signal one might expect the modeled device to produce. For example, a behavioral model of a microprocessor might provide the user with the capability of issuing various types of bus cycles, but not the capacity to actually simulate the execution of a program. The simulation model used by the simulator is usually derived from the output of the schematic editor by a schematic compiler, also making use of information about performance characteristics of the circuits stored in simulation libraries. Simulation libraries contain simulation characteristics of numerous circuit components.

Simulators often allow several different types of simulation. One type is a complete simulation run, where an initial set of conditions is specified, a set of input stimuli is defined, and the duration of the simulated run is specified. The simulator then operates on the data and produces a file of simulation results which may be displayed. Another type of simulation similar to the complete simulation run is an event termination run, whereby the simulation is run until a certain previously specified event occurs in the simulation results. The simulation may be terminated immediately at that point, or run for some simulated duration thereafter. One final type of simulation run is a stepped simulation run, whereby the current simulation may be "stepped" by one unit of time, or once clock cycle, or some other similar criterion. During simulation, the simulator needs to query a conditional statement asking how to proceed. One difficulty with conventional representations of digital circuits suitable for simulation (such as process blocks) is that all conditions are typically merged together, therefore being what is referred to as atomic in nature. By atomic, it is meant that the process blocks can not be analyzed beyond the inputs (stimuli) provided and the corresponding outputs generated. This inability to observe simulation signals from within the process block itself restricts the ability of the circuit designer to adequately characterize, debug, and/or analyze the complex digital circuit being simulated.

For this reason, it is desirable to find methods and mechanisms for use in behavioral simulations of complex circuit circuits that do not merge conditions and thereby provides improved characterization and debugging.

SUMMARY OF THE INVENTION

The present invention provides a method and mechanism for simulating complex digital circuits using hybrid control and data flow representations. Specifically, the invention provides a method of controlling the simulation of a digital circuit in such a way that desired functions are annotated for subsequent analysis. In a particularly preferred embodiment, the method selectively chooses the functions to be subsequently analyzed from within process blocks in order to run digital circuits in a non-atomic fashion.

One aspect of the invention provides a method of conducting a behavioral simulation of one or more process blocks in an electronic design. The method includes receiving an assignment decision diagram representation of the process block that includes one or more control nodes for maintaining control flow through the simulator. In this way, one or more break points are created. A simulation of the assignment decision diagram representation is run such that the simulation may be stopped when control nodes are encountered so that the state of the simulation may be observed.

Another aspect of the invention provides a behavioral simulator for conducting a behavioral simulation of one or more process blocks in an electronic design. The simulator displays the simulation results of an assignment decision representation of the process block and stops the simulation when encountering control nodes in the assignment decision representation so that the state of the simulation can be observed.

These and other features and advantages of the present invention will be further described in the following description of the invention in conjunction with the associated figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2C illustrates a portion of a process block containing an example of a loop statement in accordance with an embodiment of the invention.

FIG. 17 illustrates a graphical user interface (GUI) in accordance with an embodiment of the invention.

DETAILED DESCRIPTION OF THE PREFERRED EMBODIMENTS

Figure 1A:
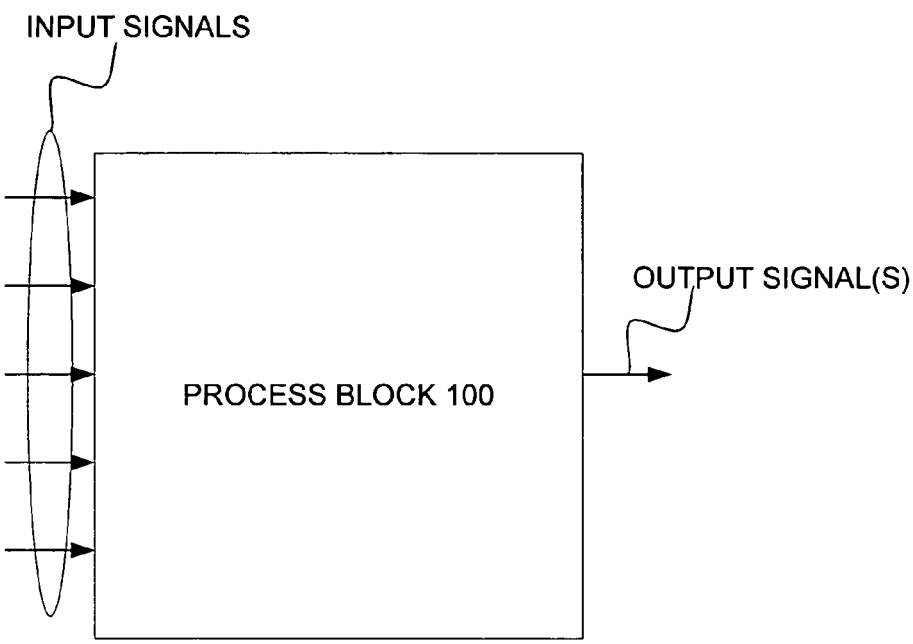
FIG. 1A shows a process block.

Some of the terms used herein are not commonly used in the art. Other terms have multiple meanings in the art. Therefore, the following definitions are provided as an aid to understanding the description that follows. The invention as set forth in the claims should not necessarily be limited by these definitions.

The term "compiler" is used throughout this specification to refer to software—and apparatus for running such software—that compiles an electronic design. Its functions may include extracting and synthesizing a netlist, mapping the design to a given hardware architecture, fitting the design, simulating the design, etc.

The term "synthesis" refers to tools that automatically create one design representation from another. Usually the mapping is from more abstract descriptions into more detailed descriptions, closer to the final form for implementation. For example, a VHDL description (discussed below) could be mapped into a collection of Boolean equations that preserve the behavior of the original specification, while describing the system at a greater level of detail.

The term "simulator" refers to programs that can dynamically execute an abstract design description. Given a description of the circuit and a model for how the elements of the description behave, the simulator maps an input stimulus into an output response, often as a function of time. Simulators exist for all levels of design description, from the most abstract behavioral level through the detailed transistor level.

The term "electronic design" generically refers to the logical structure of an electronic device such as an integrated circuit. It may be implemented on hardware (usually referred to herein generically as a "target hardware device"). During the design and development effort, an electronic design may exist in various states or stages. It may be provided as a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

VHDL, or VHSIC (Very High Speed Integrated Circuit Hardware Description Language) is a higher level language used for describing complex devices. The form of a VHDL description is described in IEEE Standard VHDL Language Reference Manual (IEEE Std 1076-1993) that is incorporated in its entirety by reference. It should be noted that the form of a Verilog description is described in IEEE Standard Verilog Language Reference Manual (IEEE Std 1364) that is also incorporated in its entirety by reference. VHDL supports three distinct styles for the description of hardware architectures. The first of these is "structural" description where the architecture is expressed as a hierarchical arrangement of interconnected components. The second style is "data flow" description, in which the architecture is broken down into a set of concurrent register assignments, each of which may be under the control of gating signals. The third style is "behavioral" description wherein the design is described in sequential program statements similar to high level programming language. It should be noted that The behavioral approach to modeling digital circuits or components is different from the other two methods in that it does not necessarily reflect how the design is implemented. The behavioral approach basically uses the concept of the black box in that it accurately models what happens on the inputs and outputs of the black box. Using the black box approach, what is inside the black box (i.e., how it works) is irrelevant. The behavioral description of VHDL is usually used in two ways. First, it can be used to model complex components that would be tedious to model using other methods. This approach would be used, for example, to simulate the operation of a complex integrated circuit or logic block such as a microprocessor. In another case, the behavioral approach could be used to simulate the operation of a custom design, such as an ASIC or PLD, connected to a commercial device, such as the microprocessor. In either case, the microprocessor and the custom design integrated circuit are complex and their internal operations are irrelevant since only the external behavior is important. Secondly, the behavioral capabilities of VHDL can be more powerful and more convenient to use for some designs.

Process Blocks

Behavioral descriptions in VHDL are supported by a "process block" 100 shown in FIG. 1A, representing VHDL code referred to as the "process statement." The code-level contents of the process block 100 can include sequential statements much like those found in software programming languages, such as those found in VHDL. These sequential statements are used to compute an output signal, or signals, of the process block based upon various input signals(s). In some cases, the outputs of the process block 100 can be specified by signal assignments included in the process block. The simulation of the complex digital circuit is accomplished by the sequential execution of multiple linked process blocks. It should be noted that the execution of a process block must be suspended in order to proceed to the execution of a subsequent process block.

Figure 1B:
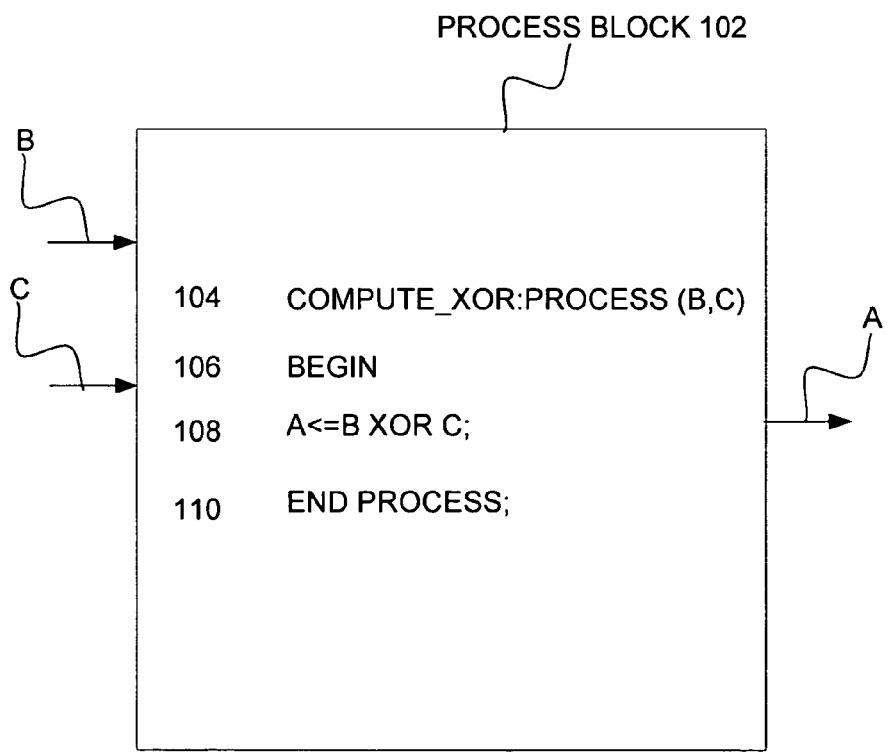
FIG. 1B illustrates an exemplary process block containing sequential statements used to simulate an XOR function in accordance with an embodiment of the invention.

Referring to FIG. 1B, program code for an exemplary process block 102 contains sequential statements 104–110 (also referred to as process statements) used to simulate an XOR function. In this example, the sequential statement 104 (i.e., "COMPUTE_XOR") is used to name the process simulated by the process block 102. Although this is optional, it is often used to label the process block for identification purposes related to, for example, debugging the digital circuit. The sequential statement 104 includes what is referred to as a keyword that starts the definition of the process block 102. In this case the keyword is "PROCESS" which is followed by a list of signals, "(B,C)" referred to as a sensitivity list. Since sequential statements included in the process block 102 typically do not indicate any structural characteristics, there is no way to know when the process COMPUTE_XOR represented by the process block 102 should be re-evaluated. By re-evaluated it is meant that the output signal (which in this case is represented by "A") is updated. For at least this reason, the signal sensitivity list (B,C) is used to specify which input signals should cause the process to be re-evaluated. For example, whenever any event occurs on one of the signals in the sensitivity list, the process is re-evaluated. A process is re-evaluated by performing each sequential statement contained within the respective process block. Typically, these sequential statements (referred to as the body of the process) appear between the "begin" and the "end" keywords. By way of example, each of the sequential statements 104–110 will be executed until such time as the last sequential statement (110) has been executed. When the last sequential statement has been executed, the process is finished and is said to be suspended. However, when an event occurs on a signal included in the sensitivity list, the process represented by the process block 102 is said to be resumed. In the case where the process is resumed, the sequential statements will be executed from top to bottom again.

Sequential Statements

There are several statements that can only be used in the body of a process block. These statements are referred to as sequential statements because they are executed sequentially one after the other as they appear in the design from the top of the process block to the bottom.

Examples of sequential statements found in VHDL are the if statement, otherwise referred to as a conditional statement, and the loop statement.

Figure 2A:
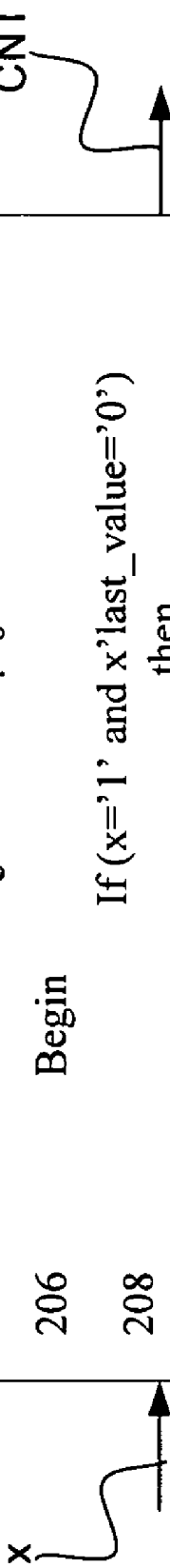
FIG. 2A illustrates a process block containing an example of a conditional statement in accordance with an embodiment of the invention.

FIG. 2A illustrates a process block 200 containing an example of a conditional statement in accordance with an embodiment of the invention. In this example, the conditional statement is represented by lines 202 through 214 and has two main parts, the condition represented by line 208 and the statement body represented by the line 210. A condition is any boolean expression (i.e., an expression that evaluates to TRUE and FALSE, such as expressions using relational operators). The condition at line 208 in this example uses the attribute "last value" to determine the last value that a signal had. Thus, in the example, the condition at line 208 is true only if the current value of x is '1' and its previous value was '0'. The statement body of the conditional statement is just a list of sequential statements that appear between the key words then and end if. In this case, for example, the statement body at line 210 increments the variable "cnt" when the condition at line 208 is TRUE.

By way of example, the execution of the conditional statement at line 210 begins by evaluating the condition at line 208. If the condition evaluates to the value TRUE, then the statements in the statement body will be executed. Otherwise, execution will continue after the "end if" and the statement body of the "if" statement is skipped.

Figure 2B:
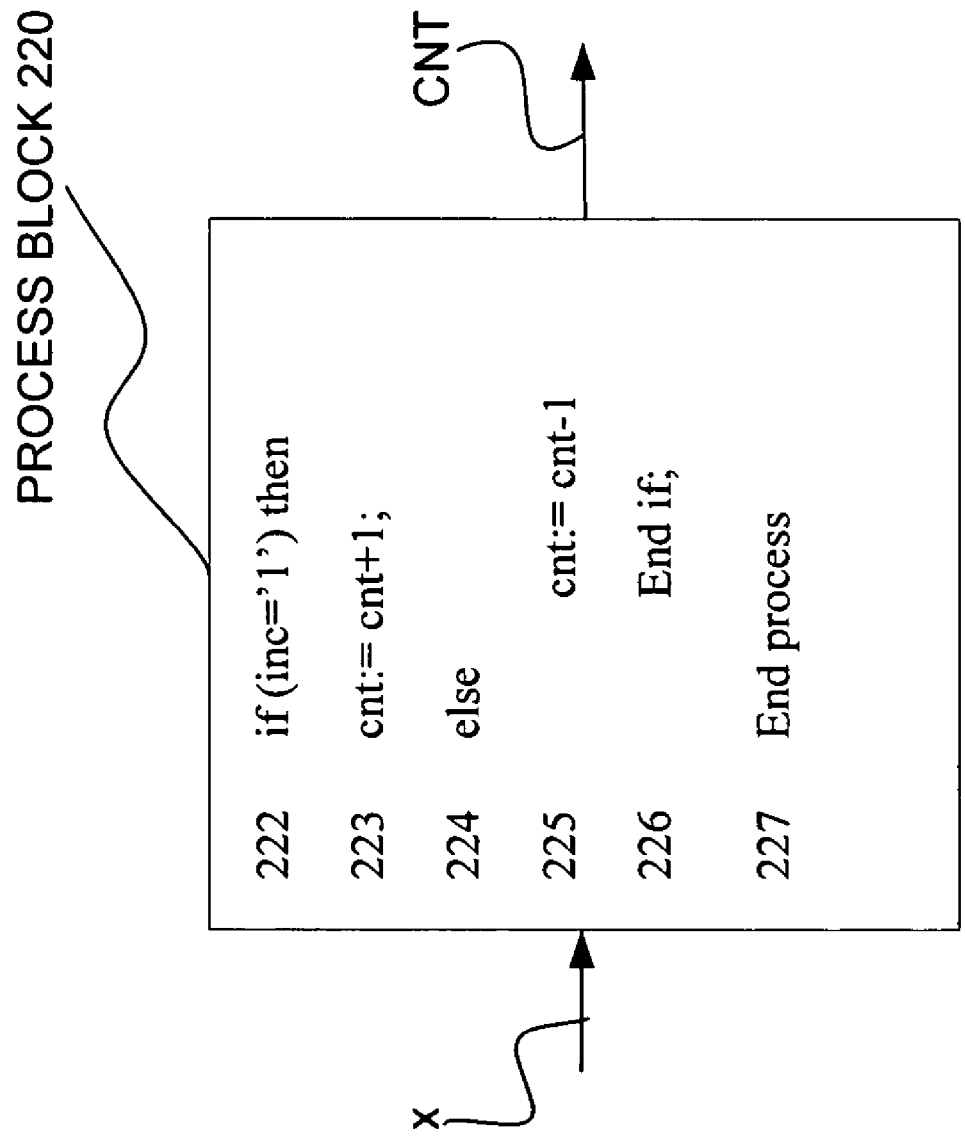
FIG. 2B illustrates a portion of a process block containing another example of a conditional statement in accordance with an embodiment of the invention.

FIG. 2B illustrates a process block 220 containing another example of a conditional statement in accordance with an embodiment of the invention.

Unlike the conditional statement shown in FIG. 2A, the form of the conditional statement shown in FIG. 2B has two statement bodies. If the condition is TRUE, the first statement body represented by statement 223 is executed (i.e., between the then and the else) and the second statement body represented by the statement 225 (i.e., between the else and the end if) is not. Otherwise, the second statement body (statement 225) is executed and the first statement body (statement 223) is not. Therefore, in this example, "cnt" will be incremented if "inc" is '1'. Otherwise, "cnt" will be decremented by "1".

FIG. 2C illustrates a process block 230 containing an exemplary loop statement 235 in accordance with an embodiment of the invention. The loop statement is used to execute a list of statements several times. In the example shown in FIG. 2C, the process block 230 computes the even parity of a bit vector.

In the example shown, the signal x is an 8 bit signal representing a byte. The first part of the exemplary loop statement 235 (i.e., "in 7 downto 0") is referred to as the parameter specification. The parameter specification creates a temporary variable and specifies how many times the loop body will be executed. In the described embodiment, the parameter specification begins with the name of the temporary variable ("i"). The temporary variable is followed by what is referred to as a keyword ("in") followed, in turn, by a range of values (7 downto 0).

The body of the loop are those statements between the parameter specification and the end loop statement. In the exemplary loop statement 235, the end loop statement is represented by the line 237 and, therefore, the body of the loop is represented by the line 236. It should be noted that the loop statement (i.e., line 236) is executed once for every value in the specified range of values called out in the parameter specification. During execution, the value of the temporary variable (i) is assigned one of the values in the specified range of values (7 downto 0) each time the loop body is executed. In this example, the assignment at line 236 will be executed first with i=7 then again with i=6, and again with i=5, and so on down to i=0. It should be noted that the value of x(i) is the value of the 8 bit signal x at bit number i (i.e., 1 or 0).

Assignment Decision Diagrams (ADD's)

The function of a digital system can be viewed as a set of computations on the input values and contents of the internal storage elements in the system. The results of these computations are stored in internal storage elements or assigned to output ports. Therefore, a digital system can be represented as a set of conditional assignments to targets that represent storage units or output ports in the form of an Assignment Decision Diagram (ADD). Rules for using ADDs are provided in "Assignment Decision Diagram for High-Level Synthesis" by Viraphol Chaiyakul and Daniel D. Gajski, Technical Report #92-102, Dec. 12, 1992 which is incorporated by reference in its entirety for all purposes.

Figure 3A:
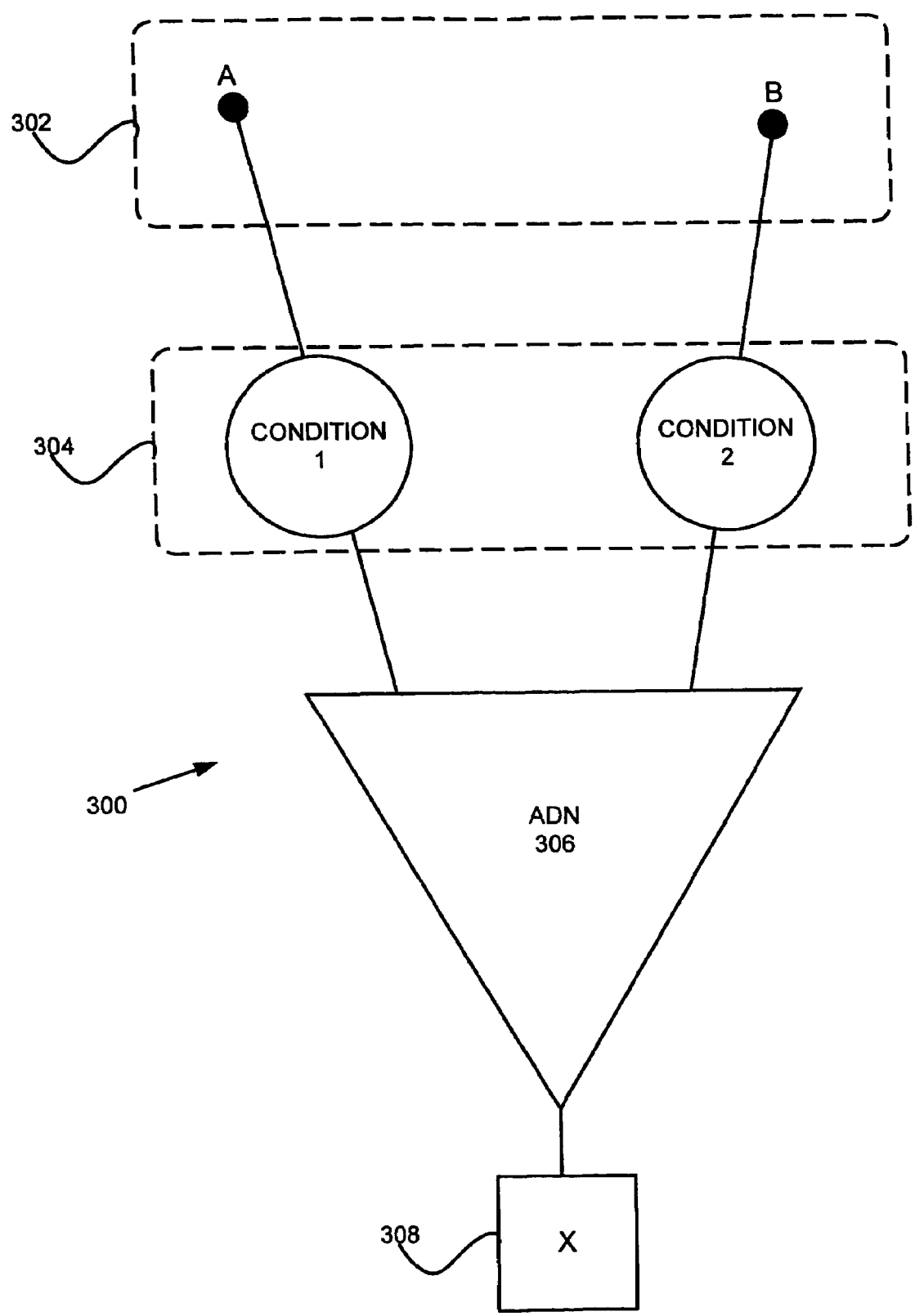
FIG. 3A illustrates a representation of an ADD in accordance with an embodiment of the invention.

FIG. 3A illustrates a representation of an ADD 300 in accordance with an embodiment of the invention. In the described embodiment, the ADD 300 can be described in four portions: (1) the assignment value portion 302, (2) the assignment condition portion 304, (3) the assignment decision portion 306, and (4) the assignment target portion 308.

The assignment value portion 302 includes read nodes and operation nodes (not shown for clarity) and represents the computation of values that are to be assigned to a storage unit of an output port. In the case of operation nodes, the values are computed from the current contents of storage units, input ports, etc. In the case of read nodes, the values are constants.

The assignment condition portion 304 includes read nodes and operation nodes that are connected as a data flow path to represent the determination of a particular condition. The end product of the condition computation is a binary value that evaluates to either TRUE or FALSE.

The assignment decision portion 306 of the ADD 300 includes an Assignment Decision Node (ADN). The ADN 306 selects a value from a set of input values that are provided to it. In a preferred embodiment, these input values are computed by the assignment value portion 302 of the ADD 300. The value selection is therefore based upon the conditions computed by the assignment condition portion 304 of the ADD 300. In a preferred embodiment, if one of the conditions to the ADN 306 evaluates to TRUE then the corresponding input value is selected.

In one embodiment of the invention, the assignment target portion 308 is represented by a write node. The write node is provided with the selected value from the corresponding ADN 306. And since only one value can be assigned to an assignment target at any given time, all assignment conditions for each target are mutually exclusive.

Figure 3B:
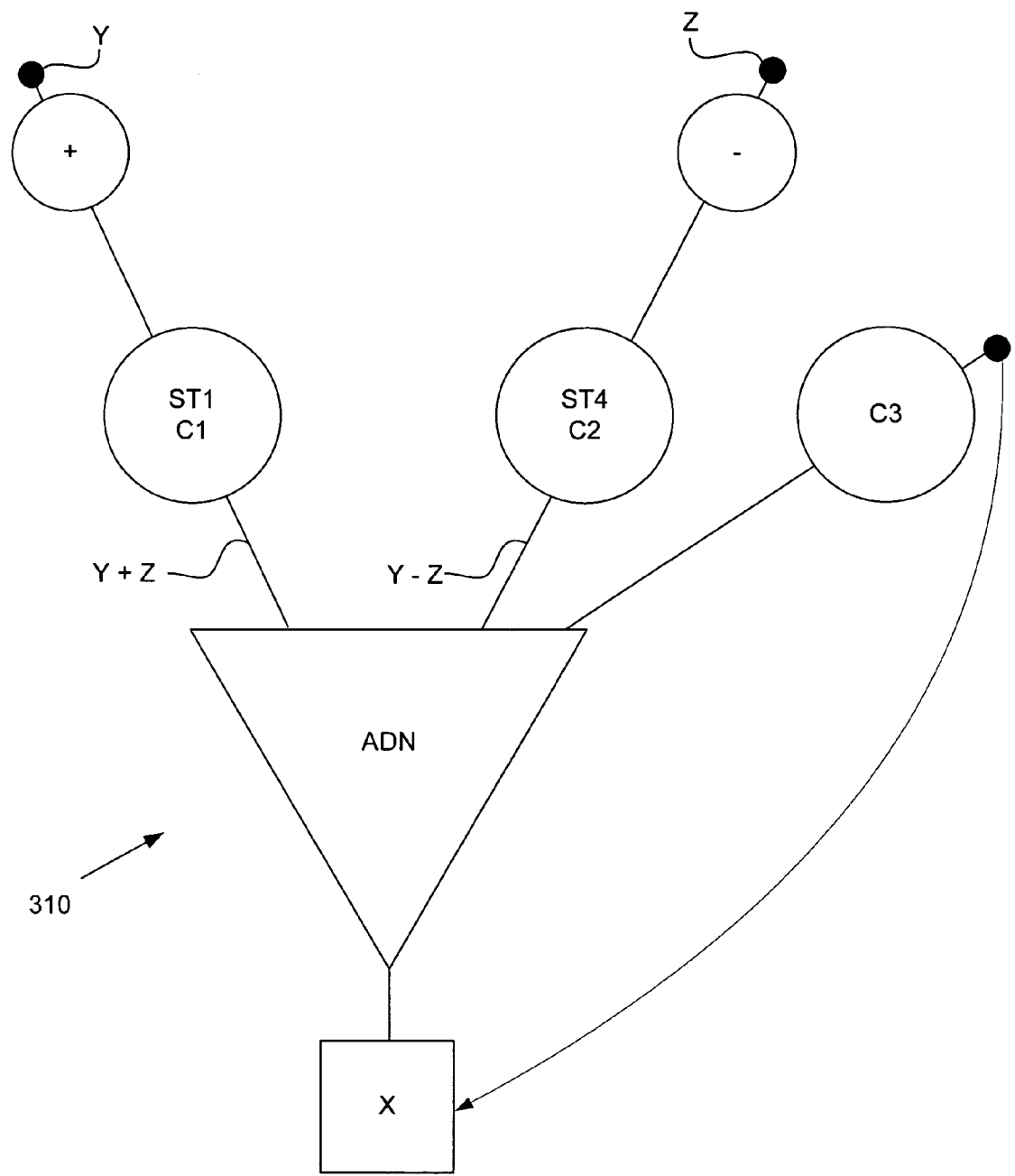
FIG. 3B shows a representative ADD operation in accordance with an embodiment of the invention.

By way of example, referring to FIG. 3B showing a representative ADD 310, the value (Y+Z) will be assigned to X if and only if the condition C1 is true and the hardware is in state ST1. Similarly, the value (Y-Z) will be assigned to X only if the hardware is in state ST4 and the condition C2 is true. Alternatively, if none of the conditions is true, then X will retain its previous value because a default condition, C3, is true.

Figure 4A:
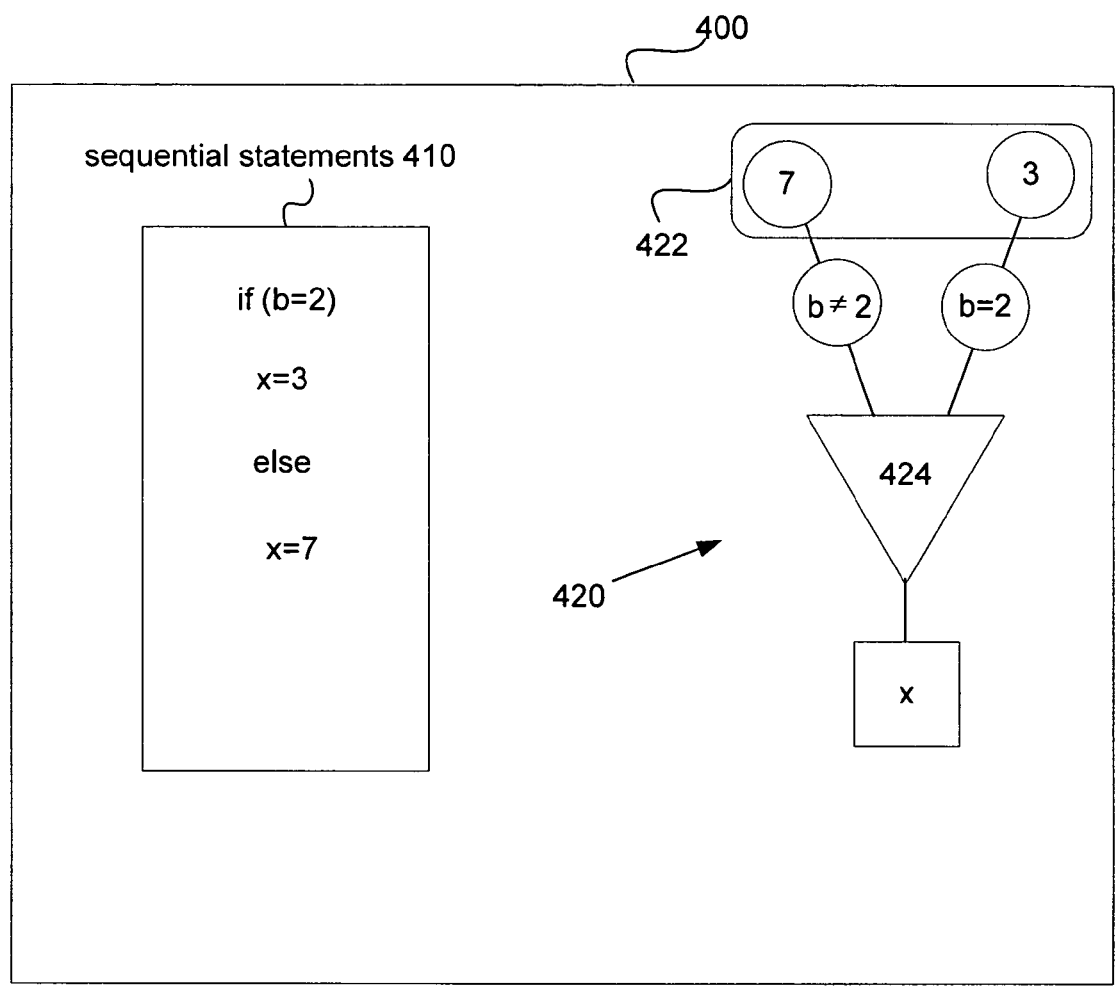
FIG. 4A graphically illustrates exemplary conversion of a VHDL conditional statement to a corresponding ADD within a process block in accordance with an embodiment of the invention.

FIG. 4A graphically illustrates exemplary conversion of a VHDL conditional statement 410 to a corresponding ADD 420 within a process block 400. The VDHL conditional statement 410 represents an IF-THEN-ELSE statement where the target node X takes on the value of 7 or 3 depending on whether or not the value of input "b" equals 2 or does not equal 2. The corresponding ADD 420 includes an assignment value portion 422 consisting of the values 7 and 3. It should be noted that the assignment value 3 represents the TRUE condition when b equals 2 whereas the value 7 represents the TRUE condition when b does not equal 2. The assignment decision portion 424 (ADN) passes the value 3 to the target X whenever input signal "b" is equal to 2 otherwise it passes the value of 7 to the target X. As described in "Assignment Decision Diagram for High Level Synthesis" by Virapol Chiayakul and Daniel D. Gajski, Technical Report #92-103, all such VHDL statements can be readily converted to corresponding ADD's.

During simulation, the simulator needs to query a conditional statement asking how to proceed. As discussed above, one of the difficulties in simulating a digital circuit using conventional simulation representations of digital circuits is that the VHDL black box representation as well as the ADD representation merge all conditions together. By way of example from FIG. 4A, all conditions are merged so only the output X is known and the simulator can not evaluate the conditions one at a time since both the process block of the VHDL representation and the ADD representation are atomic in nature. In a preferred embodiment of the invention, using what are referred to as a "control nodes" enables the user to annotate any of the sequential statements contained in, for example, a process block as well as the conditions found in an ADD. In the described embodiment, the control nodes are responsible for maintaining control flow through the simulator. By way of example, each control node includes a next pointer that is used by the simulator to point to a next process step in the simulation process. The simulator has the option to either proceed to this next process step pointed to, or if desired, treat the control node as a break point to observe the simulation process at a particular point. In this way the heretofore atomic nature of the process block as well as the ADD can be eliminated thereby improving the user's ability to debug and otherwise simulate the digital circuit being designed. Typically, the control nodes are stored in a process block control node list contained within the object file.

In the described embodiment, there are at least four control node types. One type is the conditional/query control node used to represent a branch in the control flow. A second type of control node is the evaluation (eval)/assignment control node representing an assignment. The third type of control node is the suspend control node. The suspend control node includes an event type suspend control node and a delay type control node. The event type control node causes a process block to suspend pending a future event, whereas a delay control node causes a process block to suspend for a specific length of time. A fourth type of control node is the null control node used as a place holder.

Figure 4B:
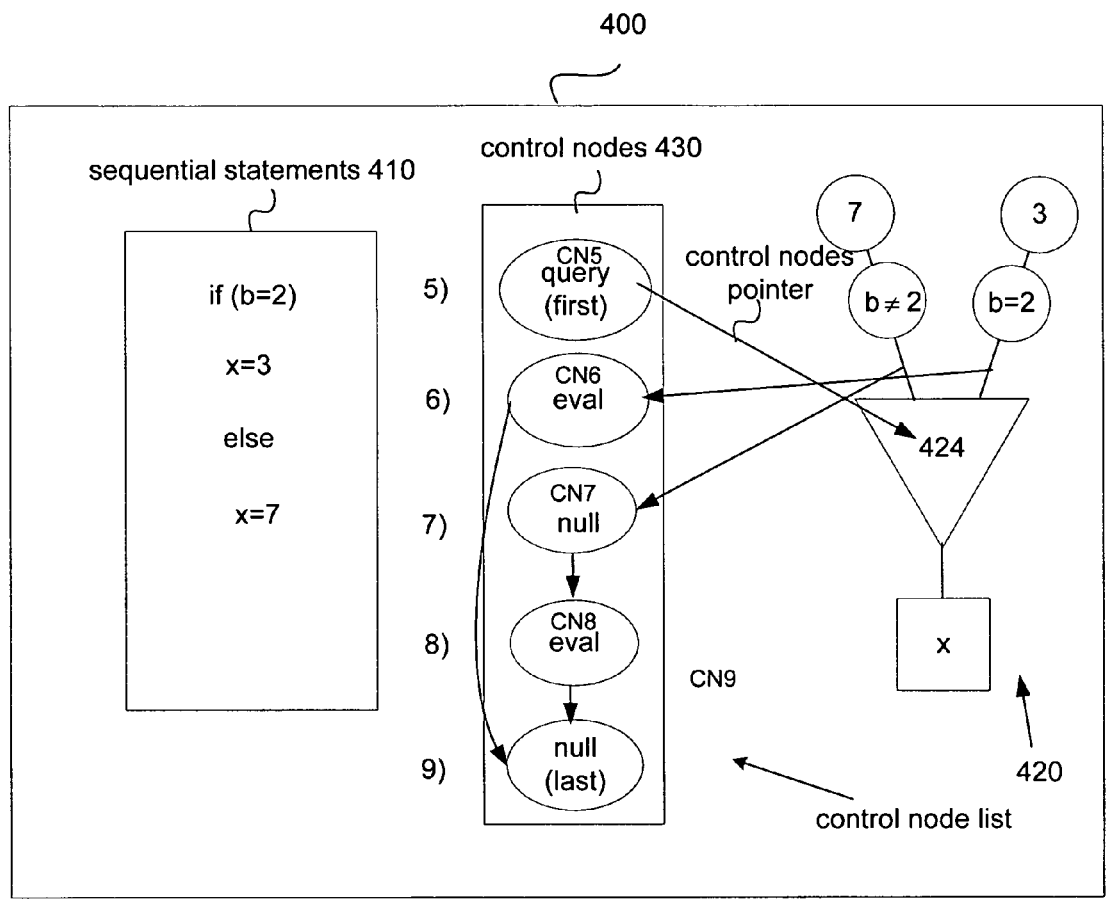
FIG. 4B shows a control node annotation of the ADD contained in the process block in accordance with an embodiment of the invention.

By way of example, using the conditional statement illustrated above, FIG. 4B shows a control node annotation of the ADD 420 contained in the process block 400 in accordance with an embodiment of the invention. As previously discussed, the sequential statements 410 representing a VHDL implemented IF-THEN-ELSE statement was converted to a corresponding ADD 420. In order to annotate the ADD 420, control nodes 430 are stored in what is referred to as a process block control node list (sometimes referred to as a "pblock CN list"). The control nodes 430 include a query CN (CN5) that "points" to the ADN 424 by way of what is referred to as a control node pointer.

As the simulator is processing the process block 400, it eventually reaches the if statement at line 5. Since this is a conditional (query) CN, the simulator calls the query method of the ADN 424 that the CN5 points to. The result of the ADN 424 query is either the eval CN (CN6) at line 6 or the null CN (CN7) at line 7 depending upon which condition is TRUE. If the "b=2" condition is TRUE the simulator reaches CN6 (an eval CN). The simulator then calls the appropriate assignment method (that would set x=3) and moves to the CN pointed to by CN6 (which, in this case is CN9, a null CN). If, however, the original condition had been false (i.e., query from CN5), the simulator would have processed CN7 (null), followed by CN8 (that would set x=7 and CN9. It should be noted that CN7 is only required in those cases if the simulator should highlight the "else" clause when debug stepping. If this is not necessary, no CN would exist for line 7, and all CNs pointing to CN7 would instead point to CN8. It should be noted the CN5 and CN9 are designated as the "first" and the "last" CN thereby establishing the starting and ending points of the IF-THEN-ELSE conditional statement included in the process block 400.

Figure 5A:
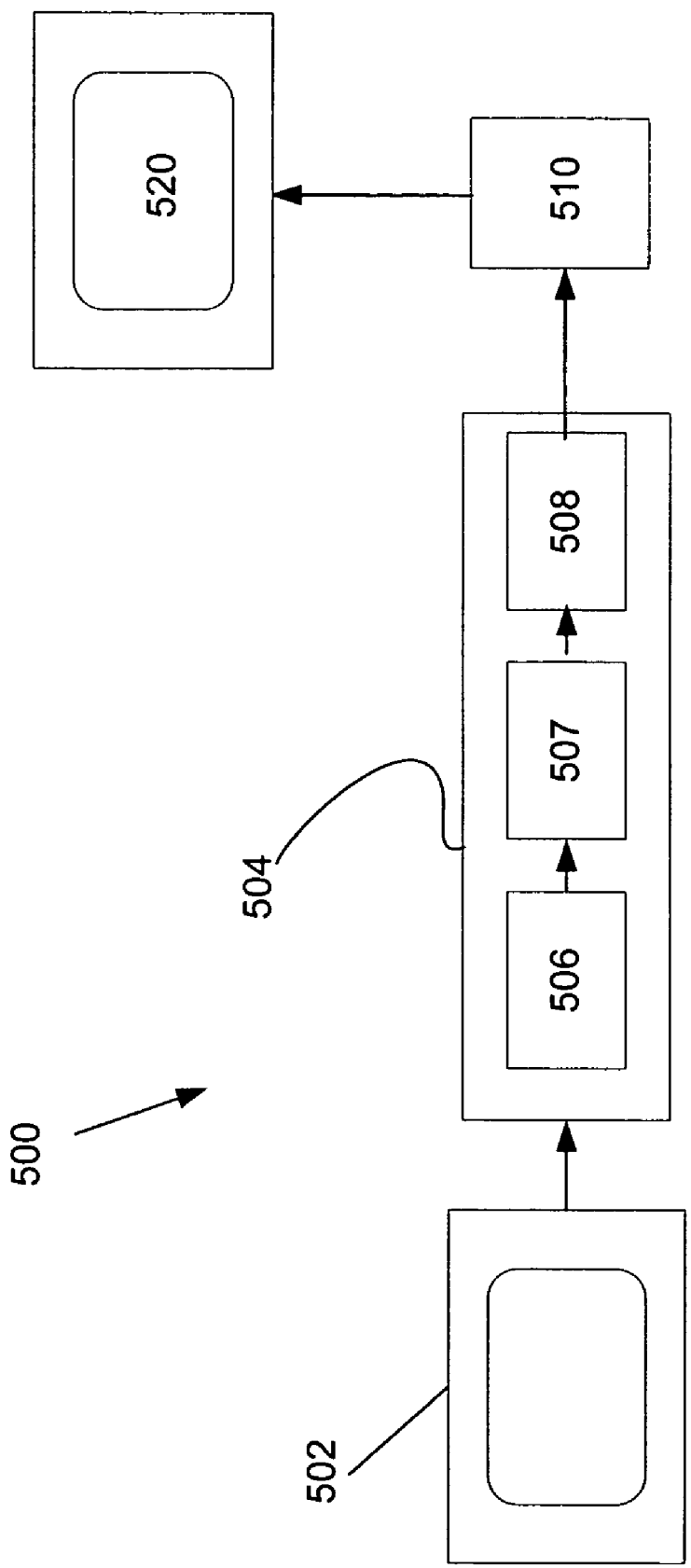
FIG. 5A illustrates an ECAD computer system in accordance with an embodiment of the invention.

FIG. 5A illustrates an ECAD computer system 500 in accordance with an embodiment of the invention. The computer system 500 includes several subsystems to assist in the design and simulation of the digital circuit. In the described embodiment, these subsystems include a schematic editor 502, a compiler 504 that includes, in one embodiment, a synthesizer 506, an extractor 507, and a control node annotator 508. In the described embodiment, the compiler 504 is connected to a simulator 510 arranged to provide a simulation of the digital circuit using the simulation object file. A monitor 512 connected to the simulator 510 is arranged to display a graphical user interface (GUI) 514. It should be understood that other system architectures and compiler designs may be employed with this invention. For example, some compilers will include a partitioning module to partition a technology mapped design onto multiple hardware entities. In addition, the compiler may be adapted to handle hierarchical designs, whereby synthesis, mapping, and the like, are performed recursively as the compiler moves down branches of a parse tree.

Figure 5B:
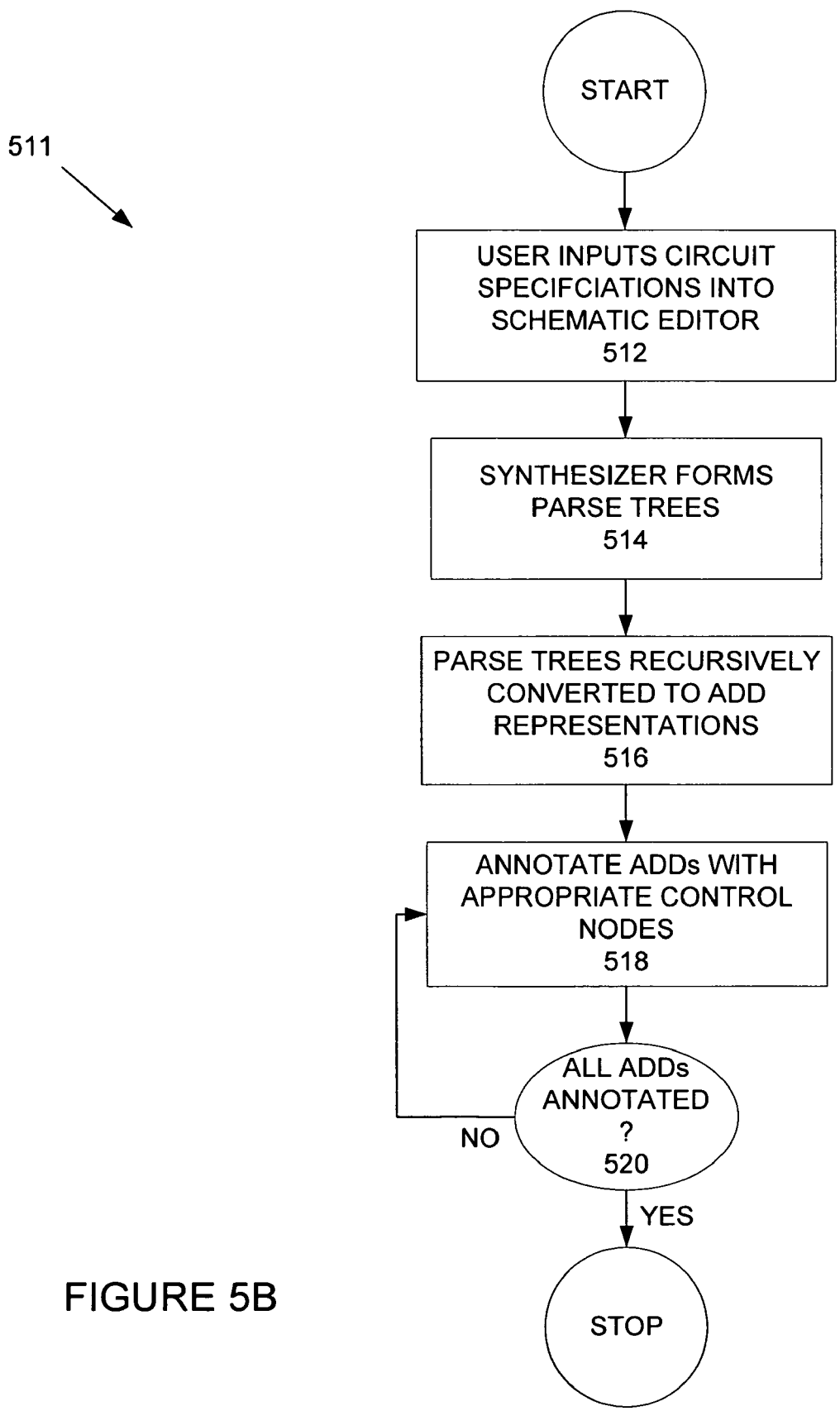
FIG. 5B details a possible process for simulating an electronic design using the computer system shown in FIG. 5A.

To simulate an electronic design using the computer system 500, for example, a process 511 detailed in FIG. 5B may be followed. First, the user inputs circuit specifications into the schematic editor (512). In the described embodiment of the invention, the user's inputs are in the form of VHDL or Verilog behavioral input data described above. The input circuit specifications may include, as examples, high and low level logic constraints, timing requirements, etc as well as connections between various individual components. In one embodiment, the synthesizer synthesizes that electronic design (514). In a preferred embodiment, the synthesized electronic design takes the form of interconnected parse trees. In the parlance of this discussion, a parse tree is used to describe the functionality of the electronic design at the process block level. Therefore, by appropriately interconnecting and evaluating the parse trees, a conventional simulation of the digital circuit is possible. Typically, there is a one to one correspondence between a particular process block and a corresponding parse tree. In this way, each process block is arranged to carry out the simulation process described by the corresponding parse tree and the interconnected parse trees, taken as a whole, provide the capability of simulating the digital circuit.

Once the synthesizer has formed and appropriately interconnected the parse trees, the extractor recursively converts each of the parse trees generated by the synthesizer to a corresponding ADD representation (516). Once each of the parse trees have been converted to a corresponding ADD, the control node annotator annotates the ADD with appropriate control nodes 518. In this way, the simulation of the digital circuit can be performed in a non-atomic fashion since the simulation can be halted at any point corresponding to a control node. A determination is then made whether or not all process block level ADDs have been annotated 520. If there are additional ADDs to be annotated, control is passed back to 518. If, on the other hand, all ADDs have been annotated, processing stops. And the digital circuit as synthesized by the compiler is now ready to be simulated by the simulator in accordance with the scope and intent of the invention.

In one embodiment of the invention, the parse tree is represented as hierarchical collection of what is referred to as tokens. The various tokens can each represent a simulation process carried out within a particular process block, process variables included within the process block, or even a process block itself. In other embodiments, the tokens can represent gates, state machines, high level constructs such as counters or adders, or any other means of defining a collection of outputs based on a collection of inputs where the nodes of the parse tree (gates, state machines, etc.) are connected together via nets.

Figure 5C:
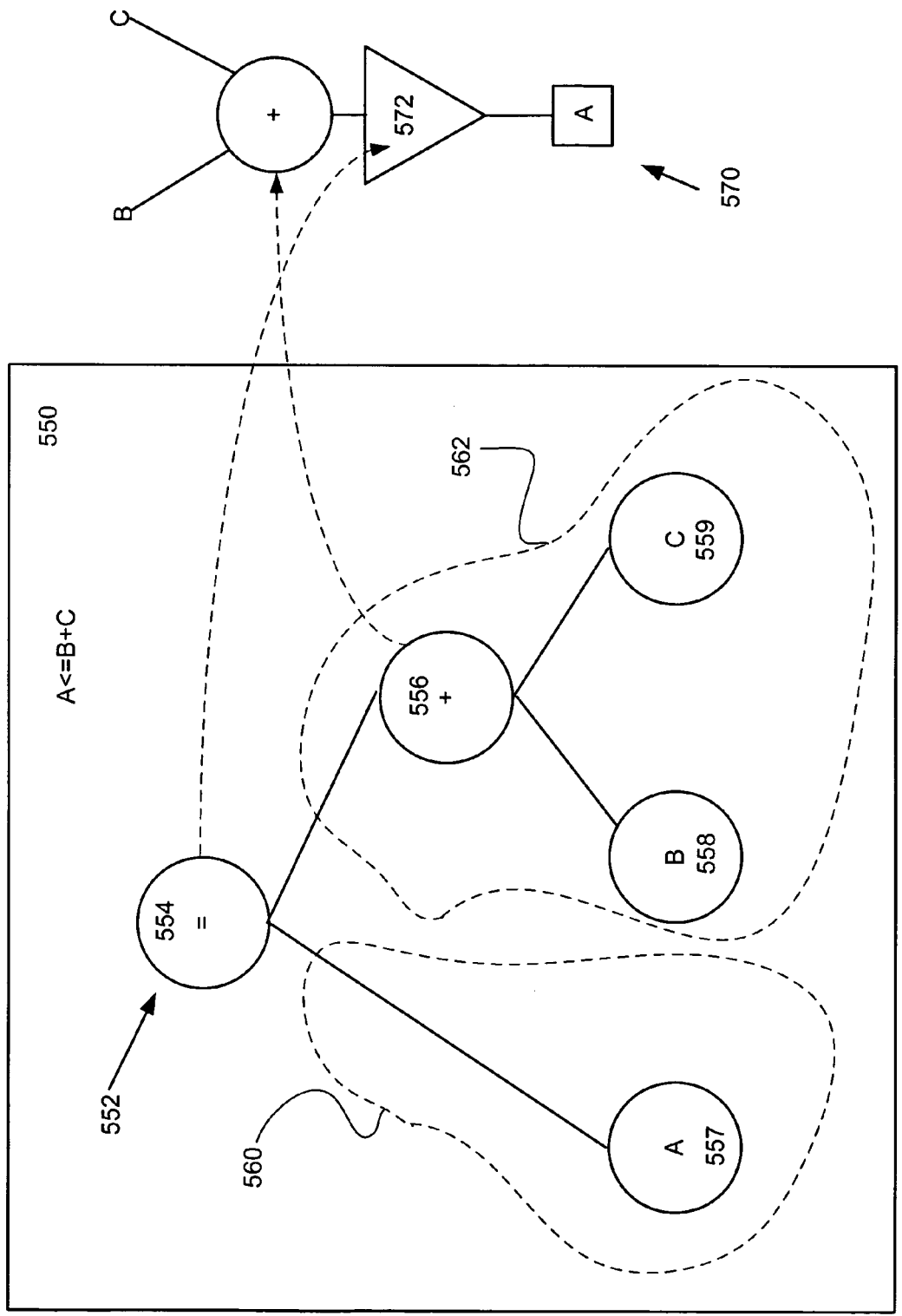
FIG. 5C shows a useful representation of a parse tree in accordance with an embodiment of the invention.

One useful representation of the parse tree is shown in FIG. 5C illustrating a parse tree 552. In this example, the parse tree 552 represents an assignment (a<=b+c) simulation process associated with the process block 550. The parse tree 552 includes a process token 554 ("="), an operator token 556 ("+") token, and variable tokens 557, 558, and 559 representing the variables "A", "B", and "C", respectively. In the described embodiment, the various tokens are interconnected in a hierarchical manner with the process token 554 occupying the highest level and the variable tokens 557, 558, and 559 each occupying the lowest hierarchical level. In the described embodiment, the process token 554 is used to identify the underlying simulation process, which in this example, is an assignment simulation process. The operator token 556 identifies the operation to be performed on the variables connected thereto represented by the variable tokens 558 and 559. In the example shown, the operator token 556 represents an addition operation (as exemplified by the addition symbol "+") that is to be performed on the variable tokens 558 and 559 representing "B" and "C", respectively. Since in this case the variable token 557 (representing the variable "A") is directly connected to the process token 554 (representing an assignment operation), the variable "A" is assigned (i.e., operated on) to the resulting value of the operation performed by the operator token 556 on the variables "B" and "C". It should be noted, that any process can be represented by an associated process token that identifies the underlying parse trees. Such process tokens include, but are not limited to conditional tokens, loop expression tokens, and so on In a preferred embodiment, the parse tree is subdivided into what is referred to as "sub parse trees" representing a particular portion, or portions, of the parse tree taken as a whole. By way of example, the parse tree 552 is divided into two sub parse trees 560 and 562. In this case, the sub parse tree 560 (also referred to as the "left most" sub parse tree) includes the variable token 557 while the sub parse tree 562 (referred to as the "right most" sub parse tree) includes the operator token 556 and the variable tokens 558 and 559. As with the tokens themselves, the sub parse trees can be allocated in any manner deemed appropriate, but are typically arranged in a hierarchical fashion based upon "left most" sub parse trees having a higher level then corresponding "right most" sub parse trees. It should also be noted, that sub parse trees can be recursively divided into their own respective sub parse trees.

Figure 6:
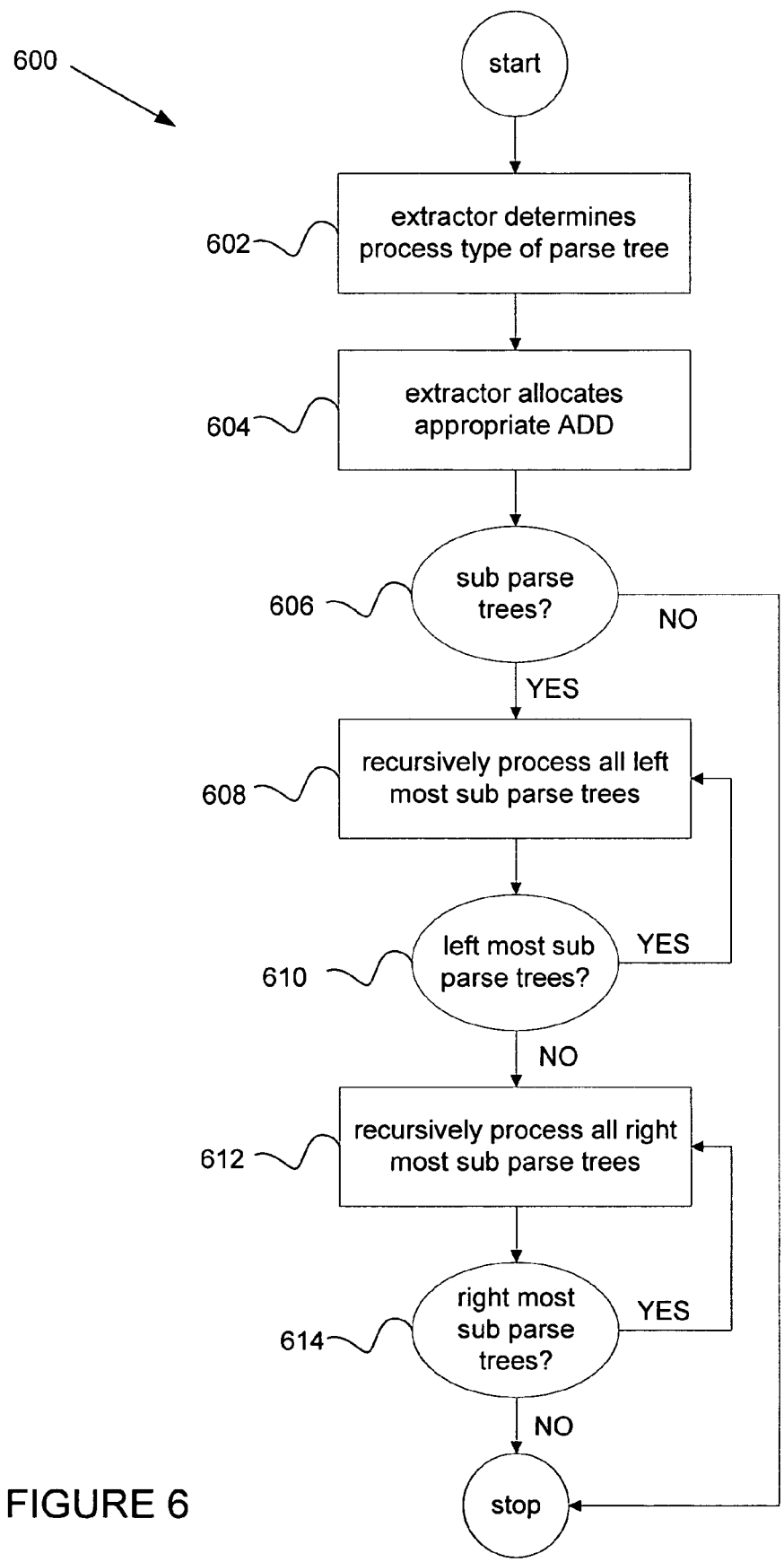
FIG. 6 is a flowchart detailing a possible process of an extractor converting a parse tree to a corresponding ADD in accordance with an embodiment of the invention.

FIG. 6 is a flowchart detailing a possible process 600 of an extractor converting a parse tree to a corresponding ADD in accordance with an embodiment of the invention. In a preferred embodiment, the extractor converts the parse tree to a corresponding ADD at the process block level. By the process block level, it is meant that each time a particular process token is encountered by the extractor, a new ADD corresponding to the simulation process identified by the encountered process token is allocated.

The process 600 begins at the highest level of the parse tree by the extractor determining the process type of the parse tree being evaluated 602. In one embodiment, the process type is determined by evaluating the process token associated with the parse tree. Once the process type has been determined, the extractor allocates an appropriate ADD 604. By appropriate, it is meant that the allocated ADD corresponds to the process type of the encountered token. Once the appropriate ADD has been allocated, the extractor goes down to the next hierarchical level of the parse tree and determines if there are sub parse trees 606. If there is a sub parse tree, the extractor recursively processes tokens on the left side of the parse tree 608 until it is determined that all left side sub parse trees have been processed 610. Once all left side sub parse trees have been processed, the extractor returns to the process token (i.e., the highest level token) and the right side parse trees are processed 612 until it is determined that all right side sub parse trees have been processed 614.

By way of example, referring back to FIG. 5C, the ADD 570 corresponding to the parse tree 552 is formed by the process 600 that begins with the extractor traversing down the parse tree 552 until it first encounters the process token 554. The extractor then determines the process type of the encountered process token and allocates the appropriate ADN 572 which in this case is an assignment ADN. After the ADN 572 is allocated, the extractor continues to traverse down the parse tree and determines that there are sub parse trees 560 and 562. The extractor then proceeds to processes the left sub parse tree 560 until it encounters the variable token 557. At this point, the extractor connects the target portion ("A") of the ADD 570 to the ADN 572. The extractor then returns back to the process token 554 and commences to recursively process the right sub parse tree 562 connecting the variable tokens 558 and 559 to the operator token 556 which in turn is connected to the process token 554

Figure 7:
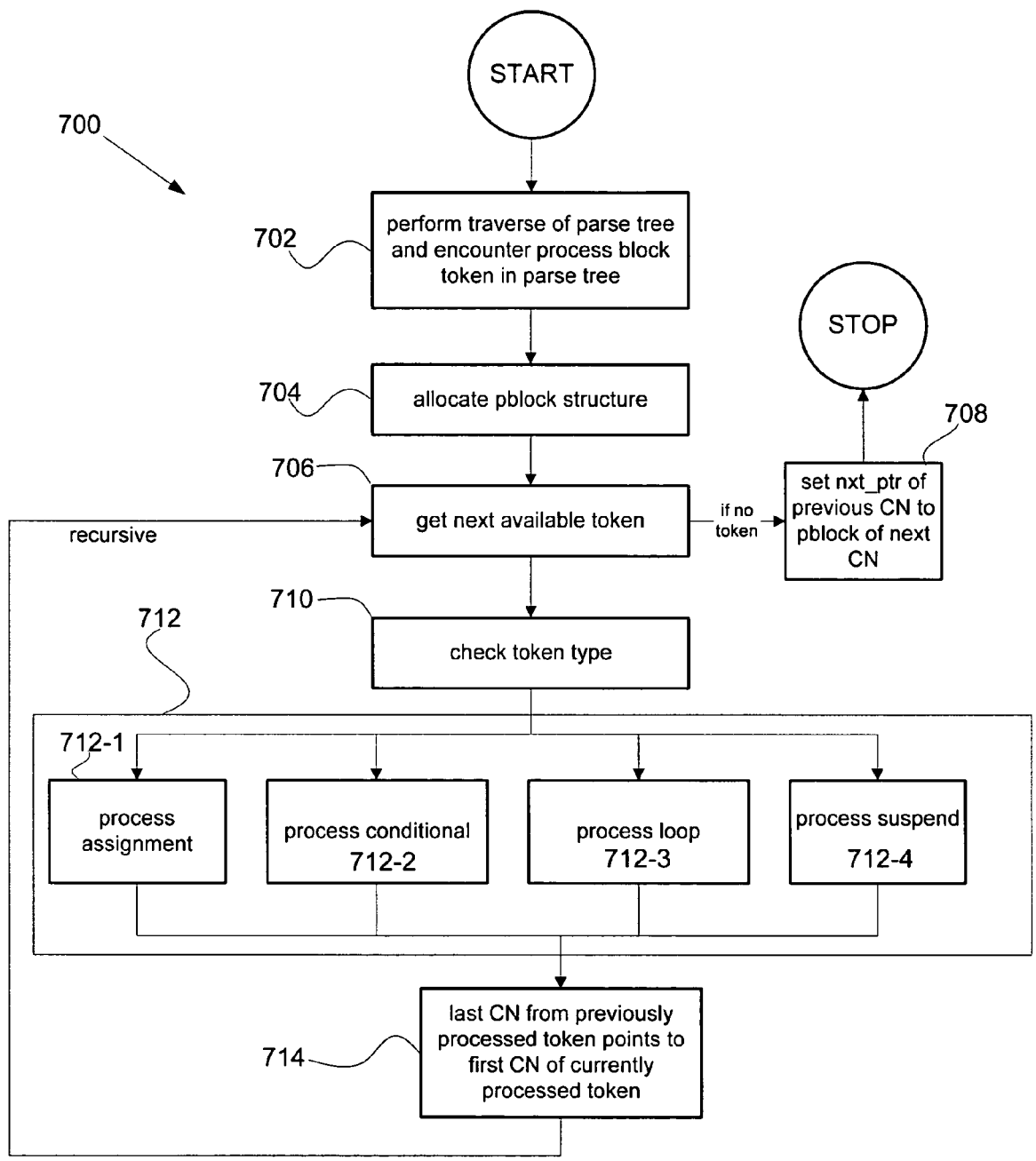
FIG. 7 illustrates one possible process flow for forming a process block object file in accordance with an embodiment of the invention.

Once the parse tree has been converted to its corresponding ADD, the simulation object file is ready to be populated. In one embodiment, the control node annotator 508 uses the parse tree to annotate its corresponding ADD with appropriate control nodes. One such approach is shown in FIG. 7 illustrating a process flow 700 for annotating an ADD with control nodes in accordance with an embodiment of the invention. It should be noted that the process 700 is but one implementation of annotating operation (518) of the process 511 shown in FIG. 5B. The annotating process 700 begins at 702 when the control node annotator performs a depth-wise traverse the parse tree. And encounters a process block token. It should be noted that by "depth-wise" it is meant that the traverse begins at the highest hierarchical level which in this case is the process block token. In the described embodiment, the process block token indicates to the control node annotator that a portion of the simulation object file is to be allocated 704 to a process block (pblock) structure. It should be noted that the process block structure is defined at that portion of the simulation object file used to store the annotated ADDs corresponding to the process block. The control node annotator then traverses down the parse tree until a next available token 706 is encountered.

If there are no available tokens, then the next pointer of the previous control node is set to point to the process block of the next control node 708. In this way, the simulator does not evaluate any process block having no process statements. If, however, a next token is available, then the control node annotator checks the token type 710. After the control node annotator has checked the available token type, it processes the available token 712 accordingly. In order to assure that the current process block is connected to the previously annotated process block the last control node from the previously processed token is set to point to the first control node of the current process statements 714. Control is then recursively moved back to 706 and the token processing is repeated until such time as there are no longer any tokens available at which point the process block object file is appropriately populated and processing stops.

So long as the recursion continues to locate available tokens, the control node annotator continues to populate the object file with annotated ADDs via loop (706), (710), (712), and (714).

Eventually each token in the parse tree has been examined and a corresponding ADD annotated with appropriate control nodes. When this occurs, 706 is answered in the negative. Thus, a complete set of annotated ADD's will have been created and the overall process 700 is complete.

Figure 8A:
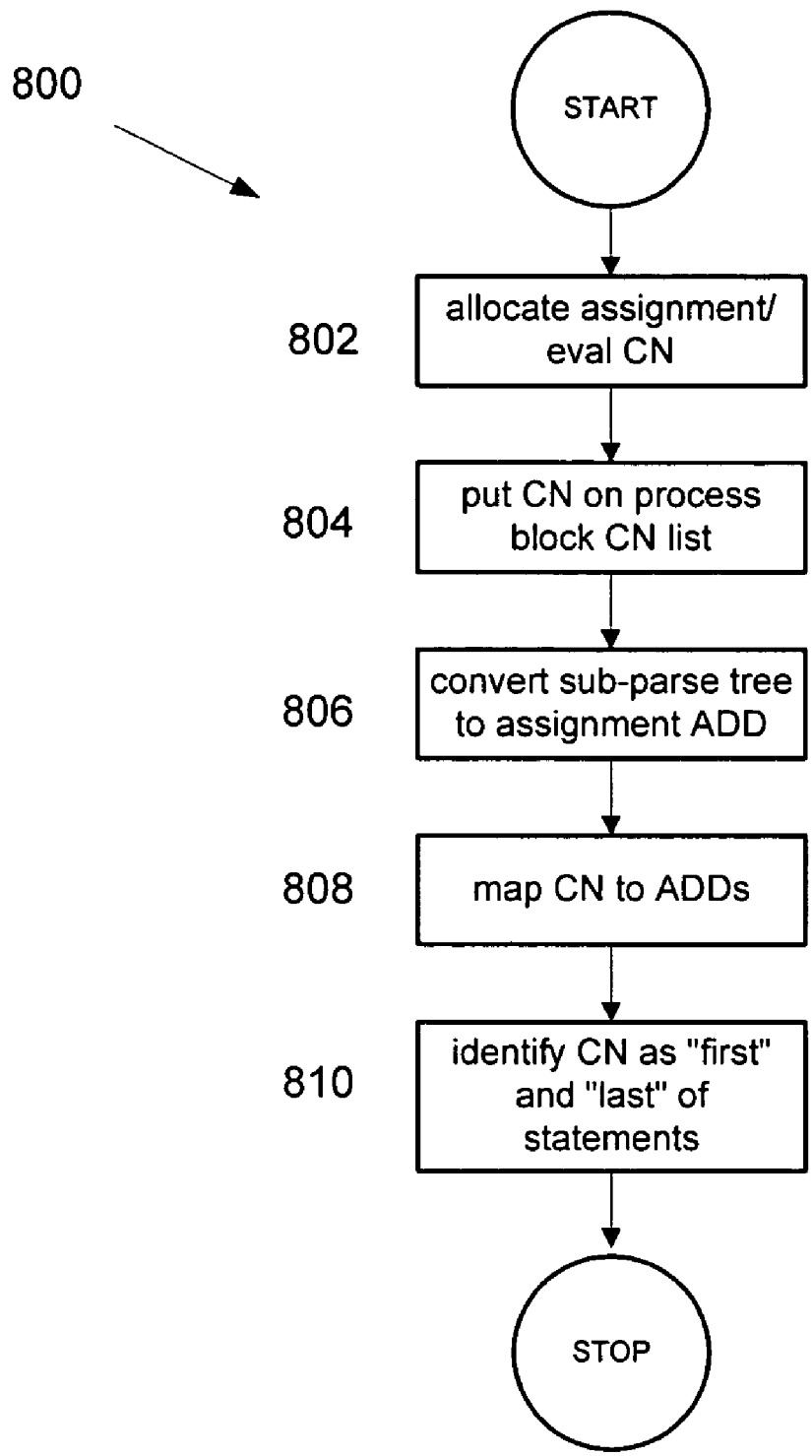
FIG. 8A details a possible process for annotating a process assignment ADD in accordance with an embodiment of the invention.

FIG. 8A details a possible process 800 for annotating a process assignment ADD in accordance with an embodiment of the invention. It should be noted that process 800 is one possible implementation of 712-1 of the process 700. The process 800 begins at 802 by allocating an assignment/eval CN. The assignment/eval CN is then added to the process block's CN list 804. At 806, the assignment sub-parse tree is converted to a corresponding assignment ADD. The assignment/eval CN is then mapped to the assignment ADD 808. Next, the assignment/eval CN is identified as the first CN and the last CN of the process assignment statements 810. At this point, the assignment statement has been fully annotated and processing is then recursively returned to the loop (706), (710), (712), and (714) until, as described above, no further tokens are available for processing.

Figure 8B:
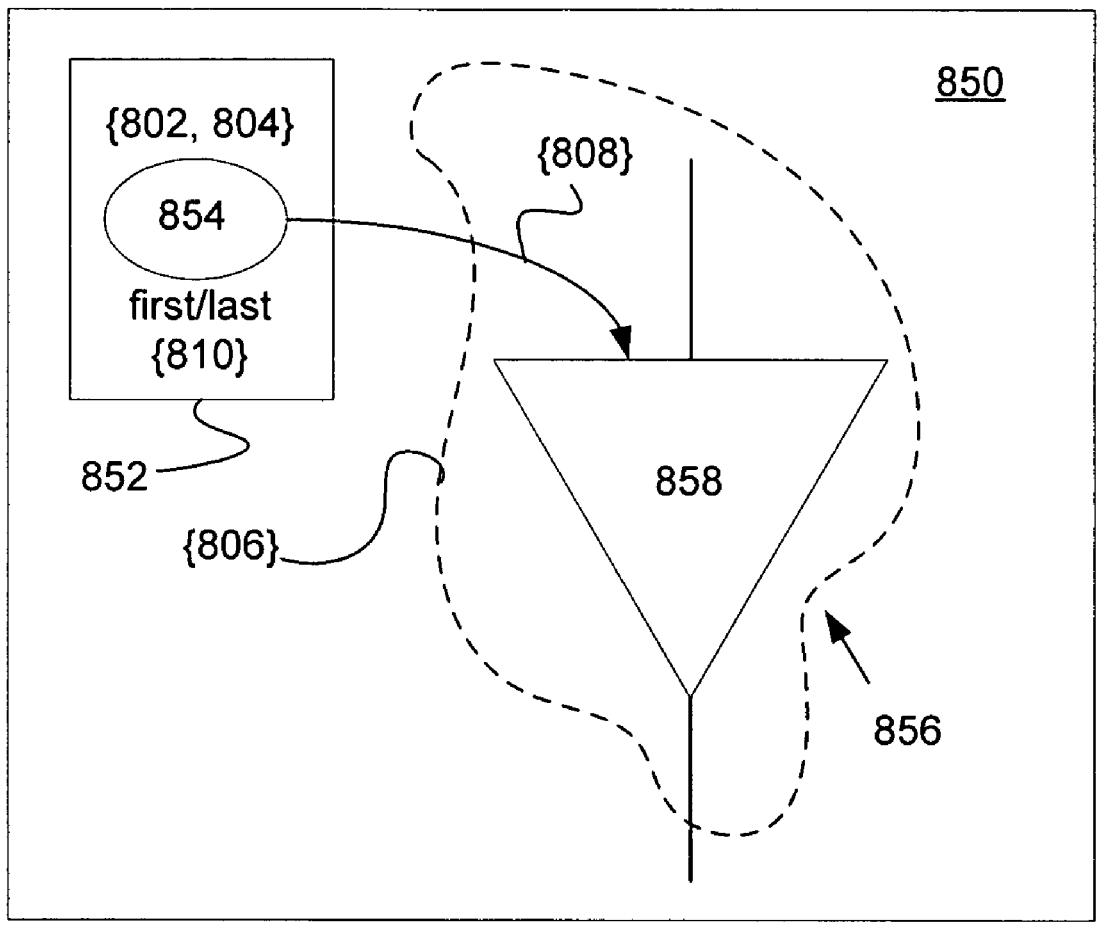
FIG. 8B is an exemplary graphical representation of a process block structure populated in accordance with the process of FIG. 8A.

FIG. 8B is an exemplary graphical representation of a process block structure 850 populated in accordance with the process 800 based upon an assignment parse tree 852. It should be noted that reference numbers enclosed in brackets "{ }" refer back to the corresponding referenced operations in the process 800. By way of example, the process block structure 850 includes an assignment/eval CN 854 allocated {802} and stored {804}in the process block's control node list. An assignment ADD 856 is allocated {806) based upon the conversion of the assignment sub parse tree. The assignment/eval CN is then mapped {808} to an assignment ADN 858 included in an assignment ADD 856. The assignment/ eval CN 854 is then identified as the first CN and the last CN {810}.

Figure 9A:
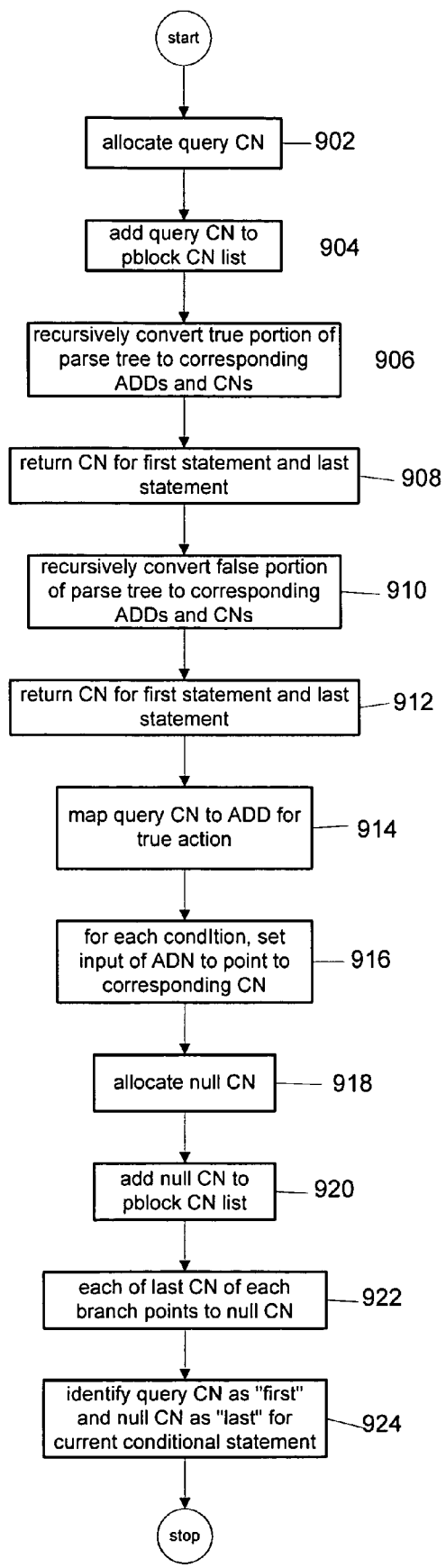
FIG. 9A details a possible process for annotating a process conditional token in accordance with an embodiment of the invention.

FIG. 9A details a possible process 900 for annotating a process conditional token in accordance with an embodiment of the invention. It should be noted that process 900 is one possible implementation of the process conditional token operation (712-2) of the process 700. The annotating of the process conditional token process begins at 902 by allocating a query CN. Remember that a query CN serves to connect to an ADN of the associated ADD. The allocated query CN is then added to the process block's CN list 904. Next, at 906, the "true" portion (the result of the conditional being evaluated as "true") of the parse tree corresponding to the process conditional is recursively converted to corresponding ADDs and associated CNs and appropriately stored via (516) and (518) of the process 511 shown in FIG. 5B. Next, at 908, the CN for the first statement and the CN for the last statement of the true portion are returned (i.e., flagged for subsequent treatment). Next, at 910, the false portion of the parse tree corresponding to the process conditional is recursively converted to corresponding ADDs and associated CNs and appropriately stored. Next, at 912, the CN for the first statement and the CN for the last statement of the false portion are returned. Control is then passed to 914 where the query CN is mapped to the corresponding ADD for the true action. Next, for each condition, the corresponding input of the ADN is set to point to a corresponding eval CN 916. A null CN acting as a place holder is then allocated 918 and added to the process block's CN list 924. The last CN for each conditional branch is then set to point to the null CN 922. The query CN in then identified as the "first" and the null CN is identified as "last" for the current conditional statement 920. At this point, the conditional statement has been fully annotated and processing is then recursively returned to the loop (706), (710), (712), and (714).until, as described above, no further tokens are available for processing.

Figure 9B:
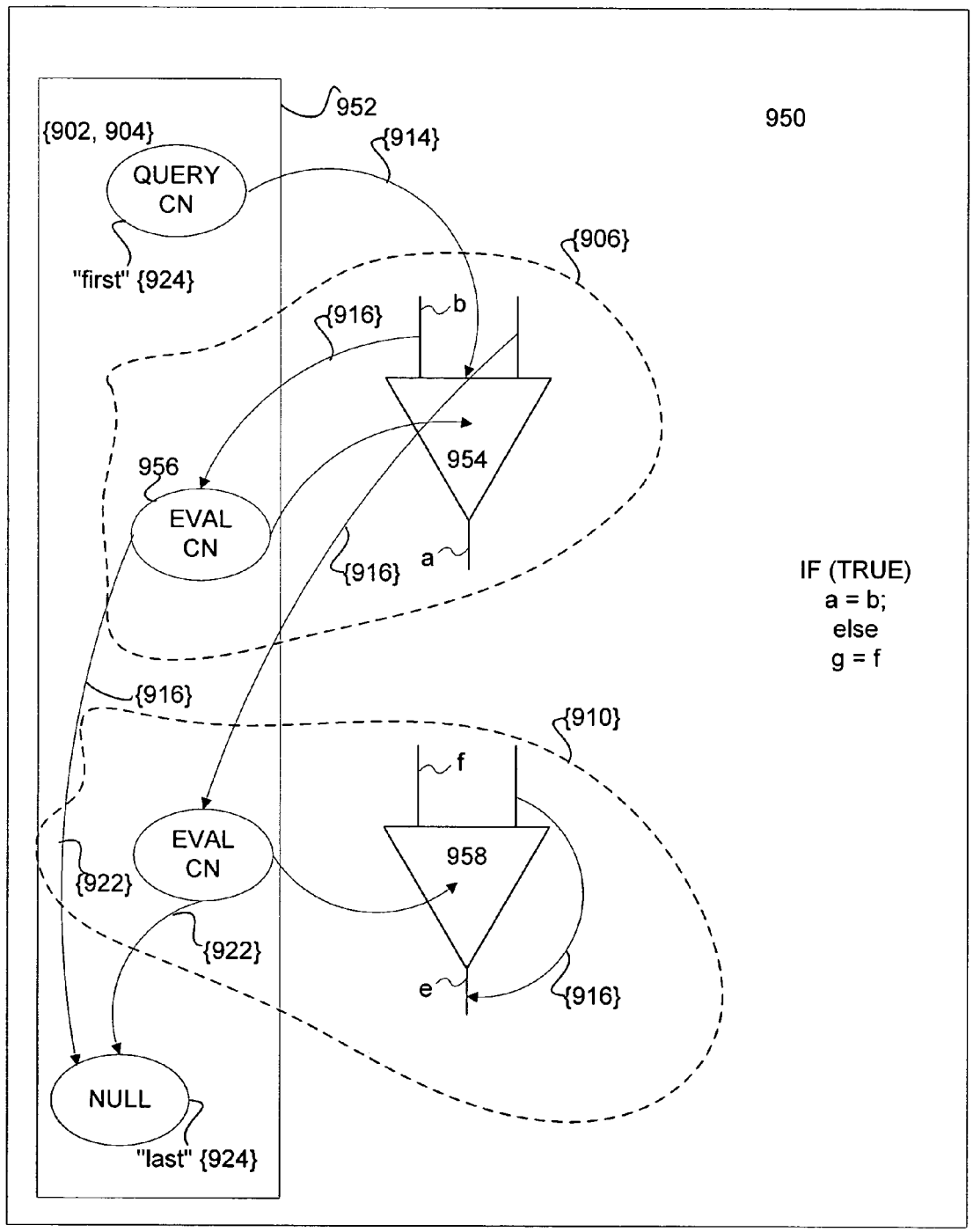
FIG. 9B is an exemplary graphical representation of a process block structure populated in accordance with the process of FIG. 9A.

FIG. 9B is an exemplary graphical representation of a process block structure 950 populated in accordance with the process 900. As with the discussion above, it should be noted that reference numbers enclosed in brackets "{ }" refer back to the corresponding referenced operations in the process 900. By way of example, the process block structure 950 includes a query CN allocated {902} and stored {904}in the process block's control node list 952. The true portion of the parse tree is converted {906} to a conditional ADN 954 and associated eval CN 956 while the false portion of the parse tree is converted {910} to a conditional ADN 958 and associated CN 960. At {914}, the query CN is mapped to the conditional ADN 954 and at {916}, each input of the conditional ADNs are set to point to its appropriate eval CN. By way of example, the true input of ADN 954 points to the eval CN 956 while the false input of the ADN 954 points to the eval CN 960 corresponding to the false portion of the conditional parse tree. A null CN is allocated and stored in the process block's control node list 952 at {918} and {920}. At {922}, each of the last CN of the true and false portions of the conditional parse tree is set to point to the null CN. At {924}, the query CN and the null CN are identified as the "first" CN and the "last" CN, respectively, of the process conditional token. In this way, the beginning and ending of the process conditional is defined.

Figure 10A:
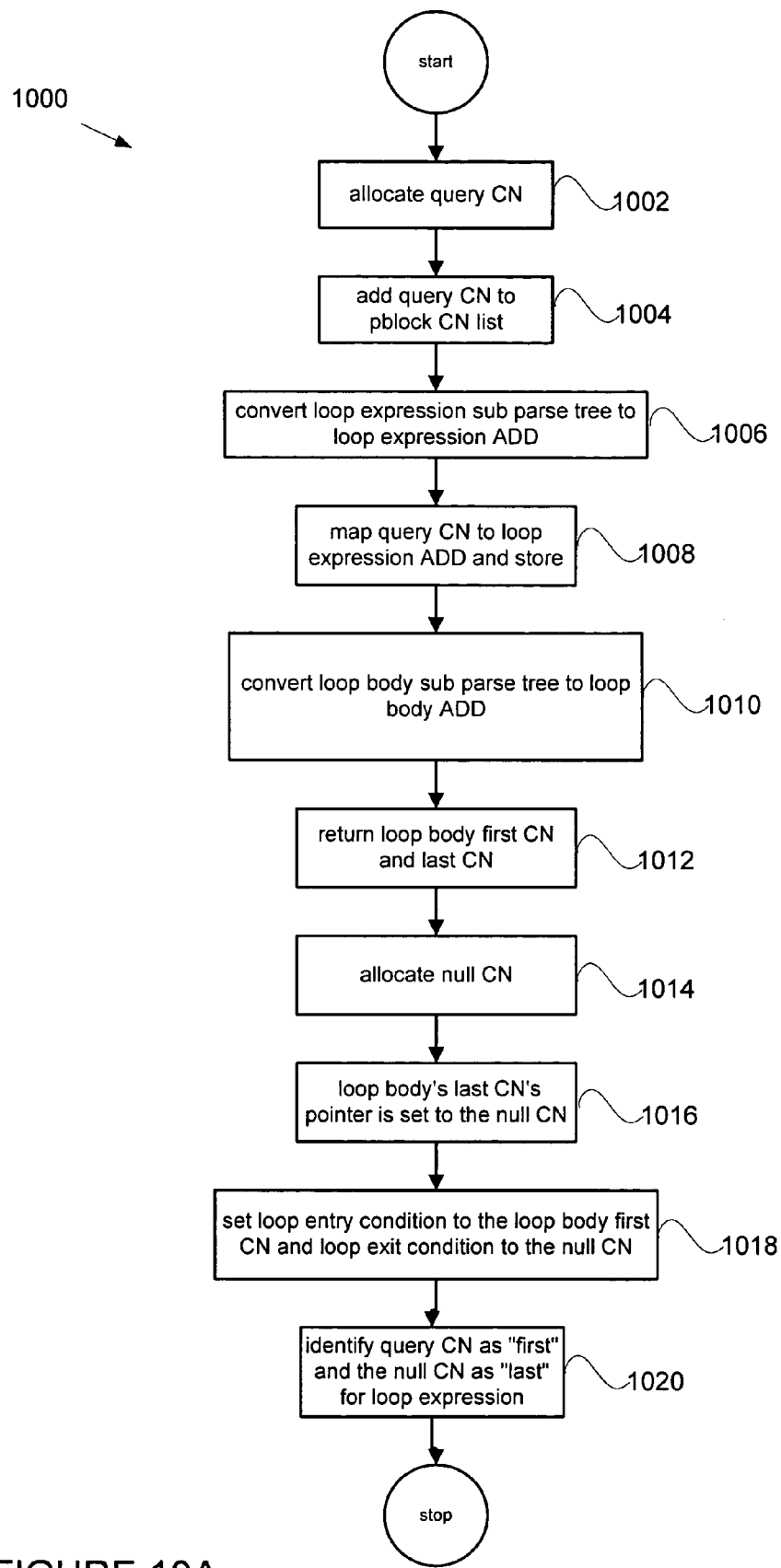
FIG. 10A details a possible process for annotating a process loop token in accordance with an embodiment of the invention.

FIG. 10A details a possible process 1000 for annotating a process loop token in accordance with an embodiment of the invention. It should be noted that process 1000 is one possible implementation of the process loop token operation (712-3) of the process 700. The annotating a process loop expression 1000 begins at 1002 by allocating a query CN. The query CN is then added to the process block's CN list 1004. Next, based upon a loop expression token, at 1006, the loop expression sub-parse tree is converted to a corresponding loop expression ADD. It should be noted that in the described embodiment, the loop expression sub-parse tree immediately follows the loop expression token in the parse tree. The query CN is then mapped to the loop expression ADD at 1008. Next, the loop body portion of the sub-parse tree is processed and the corresponding ADDs and CNs are appropriately stored at 1010. Next, a loop body first CN and a loop body last CN are then returned at 1012 thereby defining the entry and exit points of the loop body. A null CN is then allocated 1014 and the loop body last CN's next pointer is set to the null CN 1016 establishing the exit path for the loop body. Next, the loop expression entry condition is set to the loop body first CN and the loop expression exit condition is set to the null CN 1018. At 1020, the query CN is identified as the first CN and the null CN as the last CN for the current loop statement. At this point, the process loop statement has been fully annotated and processing is then recursively returned to the loop (706), (710), (712), and (714) until, as described above, no further tokens are available for processing.

Figure 10B:
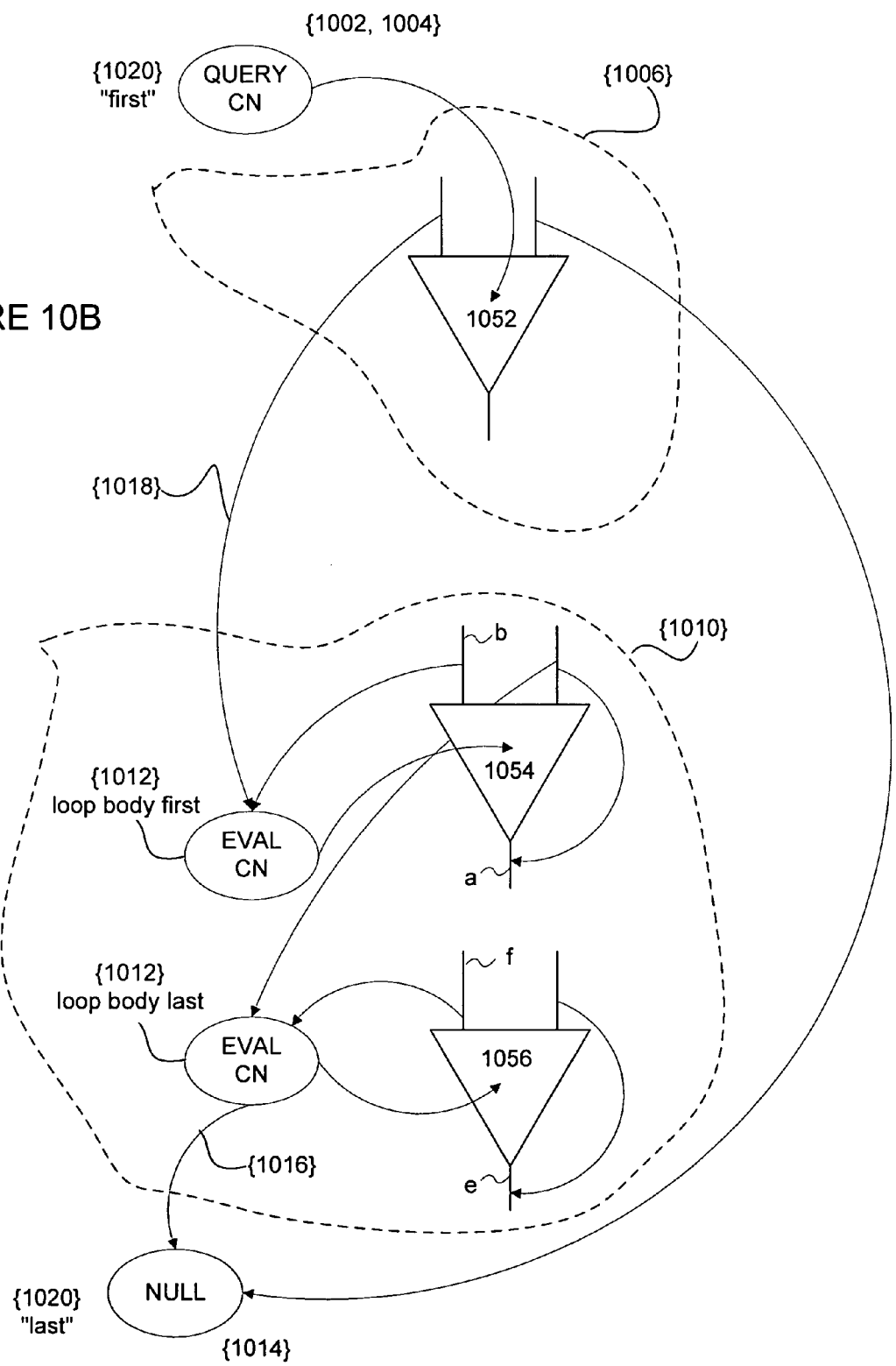
FIG. 10B is an exemplary graphical representation of a process block structure populated in accordance with the process of FIG. 10A.

FIG. 10B is an exemplary graphical representation of a process block structure 1050 populated in accordance with the process 1000. As with the discussion above, it should be noted that reference numbers enclosed in brackets "{ }" refer back to the corresponding referenced operations in the process 1000. By way of example, a query CN is allocated {1002} and added to the process block's CN list {1004}. A loop expression sub parse tree is then converted to a loop expression ADD having an ADN 1052 {1006}. The query CN is then mapped to the ADN 1052 {1008}. The loop body is then converted to loop body ADDs and corresponding eval CNs where the ADDs include ADNs 1054 and 1056, respectively {1010}. It should be noted that in the described embodiment the processing of the loop body sub parse tree is described by the process 900. The loop body first CN and last CN are returned {1012} followed by a null CN being allocated {1014}. Next, the loop body last CN's next pointer is set to the null CN {1016} followed by setting the loop expression entry condition to the loop body first CN and the loop expression exit condition to the null CN {1018}. Finally, the query CN is identified as "first" and the null CN is identified as "last" {1020}.

Figure 11A:
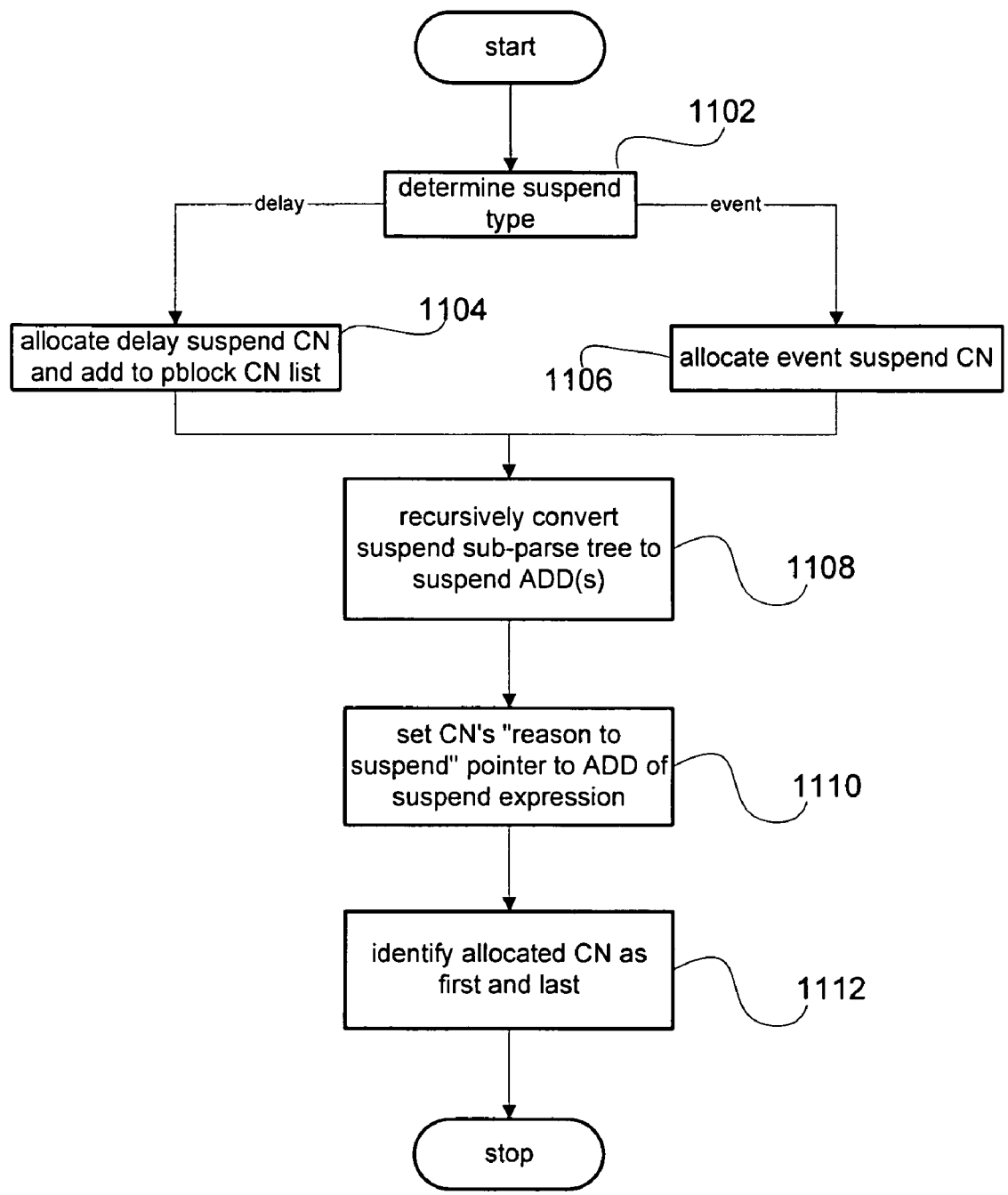
FIG. 11A details a possible process for annotating a process suspend token in accordance with an embodiment of the invention.

FIG. 11A details a possible process 1100 for annotating a process suspend token in accordance with an embodiment of the invention. It should be noted that process 1100 is one possible implementation of the process suspend token operation (712-4) of the process 700. The annotating a process begins at 1102 by determining the suspend type corresponding to the suspend token. If it is determined that the suspend type is a delay suspend type, then a delay suspend CN is allocated and added to the process block's CN list 1104. Alternatively, if it is determined that the suspend type is an event suspend type, then an event suspend CN is allocated and added to the process block's CN list 1106. It should be recalled that the event type control node causes a process block to suspend pending a future event, whereas a delay control node causes a process block to suspend for a specific length of time. Next, the suspend sub-parse tree is recursively converted to corresponding suspend ADDs 1110. It should be noted that in the described embodiment, the suspend sub-parse tree immediately follows the suspend/delay token in the parse tree. The suspend CN's "reason to suspend" pointer is then set to the suspend ADD 1112. Next, at 1114 the allocated CN is then identified as the first CN and the last CN of the process suspend statement. At this point, the process loop statement has been fully annotated and processing is then recursively returned to the loop (706), (710), (712), and (714).until, as described above, no further tokens are available for processing.

Figure 11B:
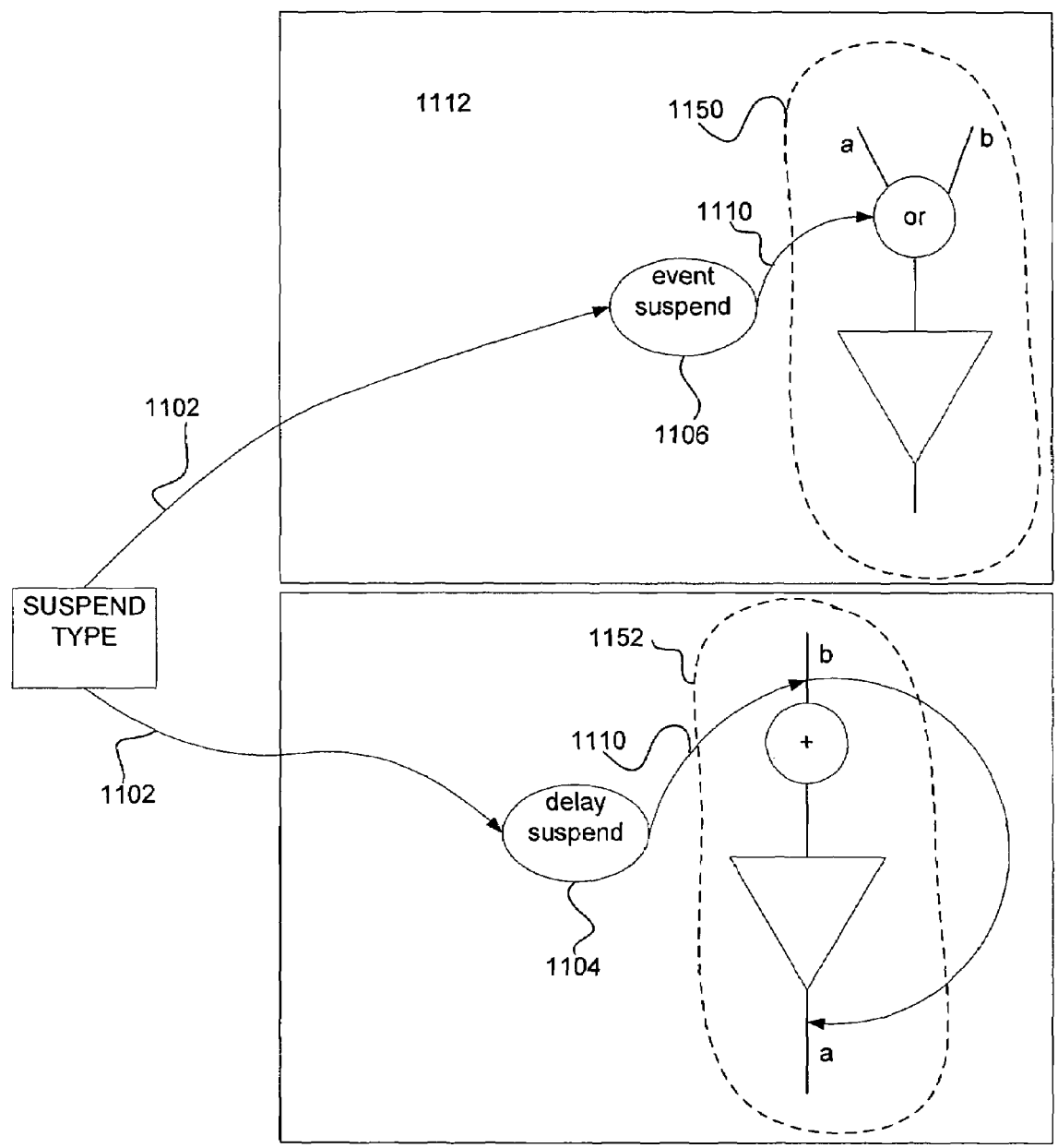
FIG. 11B is an exemplary graphical representation of a process block structure populated in accordance with the process of FIG. 11A.

FIG. 11B is an exemplary graphical representation of a process block structure 950 populated in accordance with the process 1100. As with the discussion above, it should be noted that reference numbers enclosed in brackets "{ }" refer back to the corresponding referenced operations in the process 1100. By way of example, if it is determined that the suspend token is an event suspend token {1102}, then an event suspend CN is allocated {1106}. Alternatively, if it is determined that the suspend token is a delay suspend token {1102}, then a delay suspend CN is allocated {1104}. Once the appropriate CN has been allocated, the suspend sub parse tree is recursively converted to a corresponding ADD. In the case of an event suspend token, an ADD 1150 is allocated {1108} having an conditional assignment portion represented by the logical "OR" function and a corresponding assignment value portion represented by, in this example, the event(s) (a or b) which triggers the suspend. The reason_to_suspend pointer of the event suspend CN is then set to point to the ADD 1150 {1110} and the event suspend CN is identified as the "first" and "last" CN {1112}.

Similarly for a delay suspend token, an ADD 1152 is allocated having in this case, however, a single assignment value which after the appropriate period of time designated as the delay, is assigned to the output node of the ADD 1152.

Preferably, the control nodes of this invention are implemented in an object oriented system. An object oriented system includes number of individual software "objects". Each object in the object oriented system further includes a collection of data along with a set of invocable functions that act on or use the collection of data in the object. The collection of data is referred to as the object's state data. The functions that manipulate the state data in the object are referred to as operations. Each object in the system has an object manager that is the server that implements the operations of the object and maintains the collection of data with the object.

Figure 12:
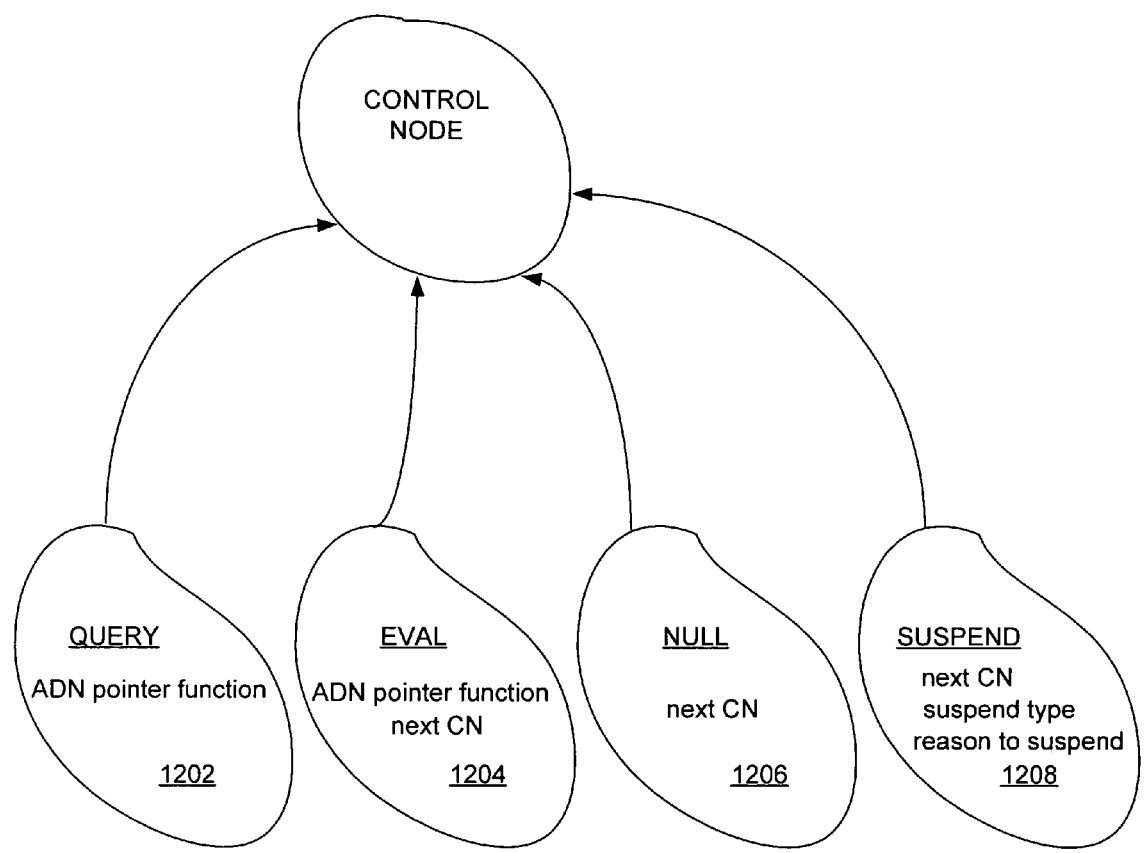
FIG. 12 illustrates control nodes as objects in an object oriented programming system in accordance with an embodiment of the invention.

Referring to FIG. 12, in such an object oriented system (OOP), the control node (CN) can be represented by a CN object 1202 having at least four classes of objects, the query CN object 1204, the eval CN object 1206, the null CN object 1208, and the suspend CN object 1210. In the described embodiment, the query CN object 1204 includes an ADN pointer function used to set the next pointer of the query CN object 1204 to a particular AND. The eval CN object 1206 includes in addition to an AND pointer function, a next_CN function used to set the next pointer of the eval CN object 1206 to a next control node. This function is useful in, for example, processing conditional and/or loop expression sub parse trees in accordance with the invention. The null CN object 1208, however, only includes a next CN function since the null CN object 1208 is only used as a place holder. Finally, the suspend CN object 1210 includes a next CN function, a suspend type function (to indicate whether delay or event suspend type), and a reason_to_suspend function.

Figure 13:
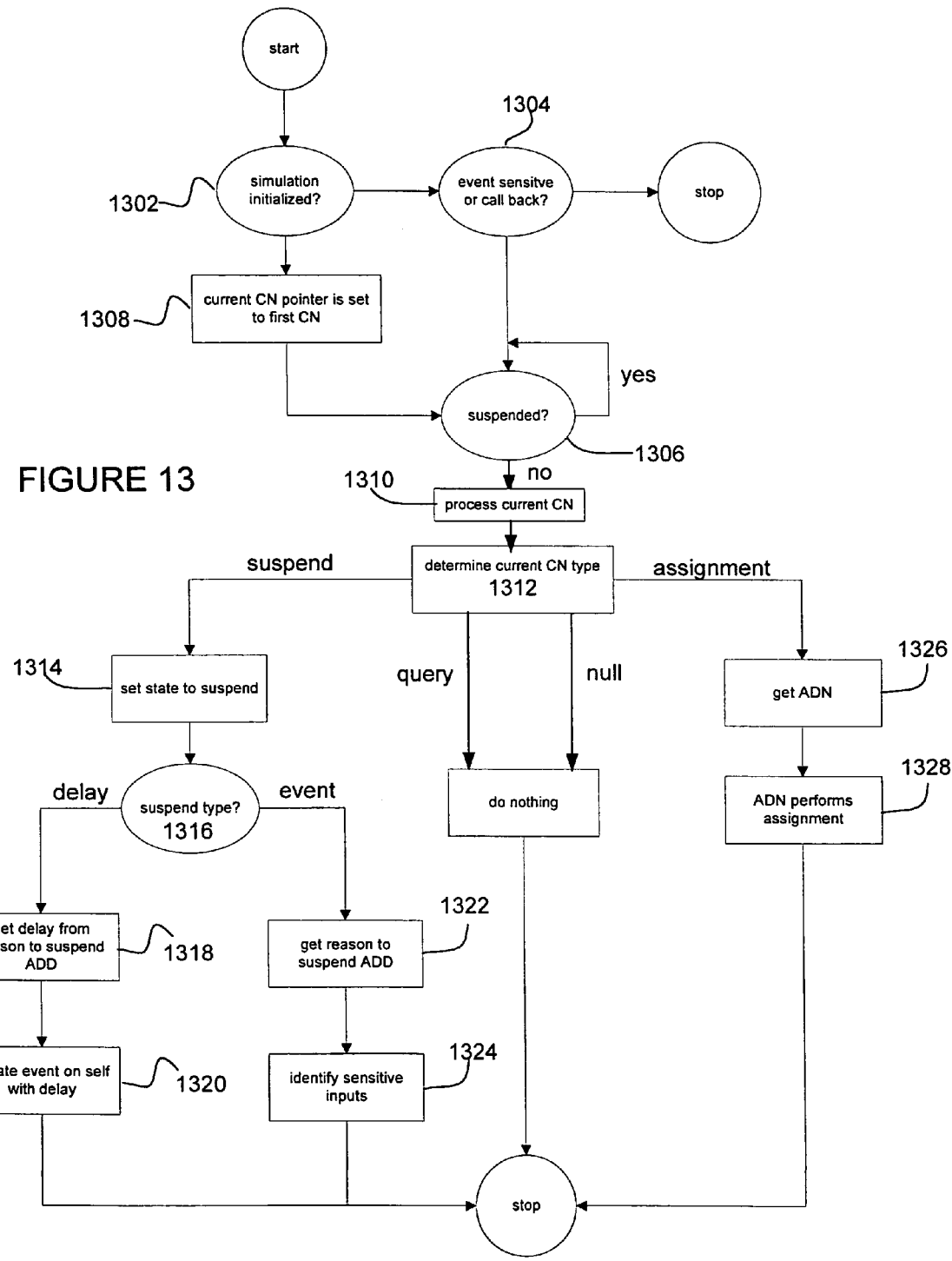
FIG. 13 details a possible process for simulating a digital device based upon annotated ADDs in accordance with an embodiment of the invention.

Once all the parse trees have been processed, the compiler appropriately stores the annotated ADDs which are then made available to the simulator. FIG. 13 details a possible process 1300 for simulating a digital device based upon annotated ADDs in accordance with an embodiment of the invention.

The simulation begins at 1302 where it is determined if the simulation is being initialized. If it is determined that the simulation is not being initialized, then it is determined if the simulation is event sensitive or a call back 1304. In the described embodiment, a process block has two methods, a simulate_me method and a callback_me method. If the simulator engine asks the process block to "simulate_me" it is an input change, otherwise it is referred to as a callback. Callbacks are used for time simulations (i.e., do this 10 seconds in the future). Events are used to simulate a block when the block's inputs change such as when the previous block is simulated. If it is determined that the simulation is neither event sensitive or a call back, then the simulation stops. Otherwise, it is determined if the simulation is suspended 1306. If it is determined that the simulation is suspended, then the suspension is in effect until appropriately released.

Returning to 1302, if it was determined that the simulation is being initialized, then the current CN pointer is set to the first CN at 1308. Next, if it is determined that the simulation is suspended at 1306. It should be noted that in the described embodiment, a process block contains a state flag indicating the current state of the process block. One such flag is referred to as a suspend flag indicating that the process block's state is suspended. If it is determined that the state of the process block is suspended, then the suspension is in effect until appropriately released, otherwise the current CN is processed at 1310. As part of the processing of the current CN, at 1312, the current CN type is determined. If the current CN type is a query CN or a null CN, then the simulation is stopped.

If, however, it is determined that the current CN is a suspend type CN, then the simulator state is set to suspend 1314. In this situation, the simulation of the design continues. The process block suspends letting other process blocks be simulated. The period of time that the simulation will be suspended will depend upon the type of suspend which is determined at 1316. If it is determined that the suspend type is a delay suspend type, then the delay from reason to suspend ADDs 1318 is retrieved. Next an event on self with the delay is created 1320.

Returning to 1316, if it is determined that the suspend type is an event suspend type, then the reason to suspend ADDs are retrieved 1322 and the sensitive inputs are identified 1324. In one embodiment, the non-sensitive inputs are turned off and the sensitive inputs are turned on. Examples include an "@clk;" statement in Verilog and a "wait for clk;" statement in VHDL.

Returning to 1312, if is determined that the current CN is an eval/assignment CN, then the corresponding ADN is retrieved 1326 and the ADN then performs the assignment 1328.

Returning to 1312, if it is determined that the current CN is a null CN or a query CN, then nothing is done and control is passed back to 1312.

Figure 14:
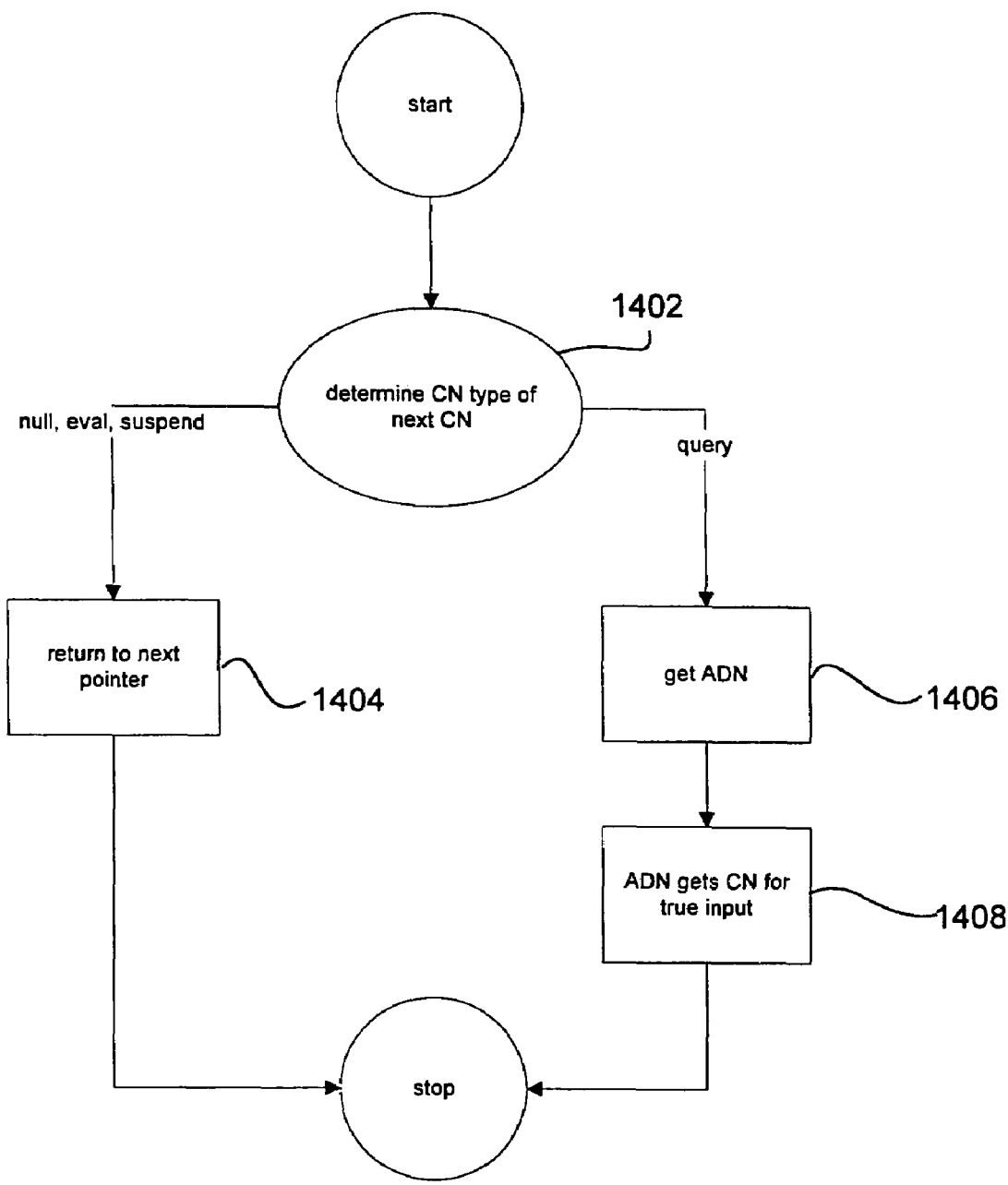
FIG. 14 details a possible process for getting a next CN to process operation in accordance with an embodiment of the invention.

Once the current CN has been processed, the simulation then must recursively process a next CN. Therefore, FIG. 14 details a possible process 1400 for getting a next CN to process operation in accordance with an embodiment of the invention. The process 1400 begins at 1402 by determining the CN type of the next CN. If it is determined that the next CN to process is a null CN, an eval/assignment CN, or a suspend CN, then the next CN pointer is returned 1404. If the next CN to process is a query CN, then the corresponding ADN is retrieved 1206 and the CN for the true input of the ADN is retrieved 1408.

Embodiments of the present invention relate to an apparatus for performing the above-described operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 15:
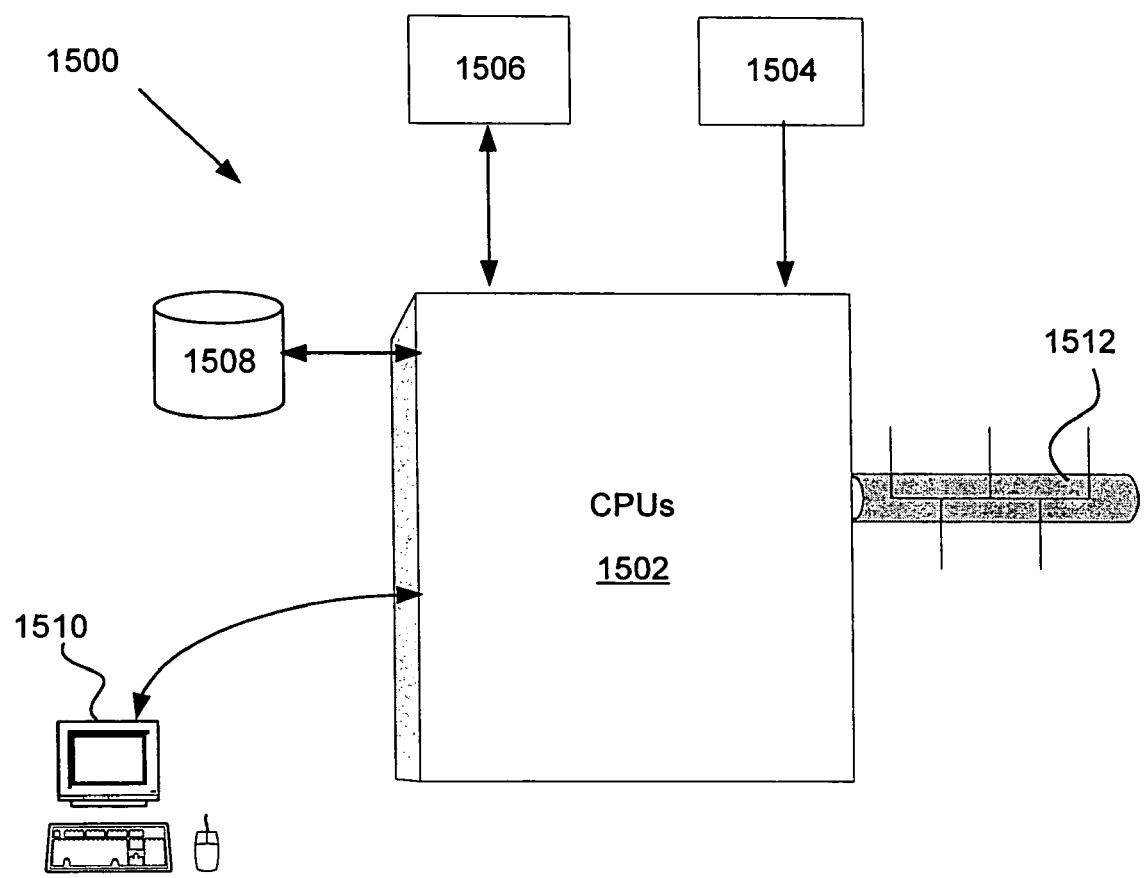
FIG. 15 illustrates a typical computer system in accordance with an embodiment of the present invention.

FIG. 15 illustrates a typical computer system in accordance with an embodiment of the present invention. The computer system 1500 includes any number of processors 1502 (also referred to as central processing units, or CPUs) that are coupled to storage devices including primary storage 1506 (typically a random access memory, or RAM), primary storage 1504 (typically a read only memory, or ROM). As is well known in the art, primary storage 1504 acts to transfer data and instructions uni-directionally to the CPU and primary storage 1506 is used typically to transfer data and instructions in a bi-directional manner. Both of these primary storage devices may include any suitable of the computer-readable media described above. A mass storage device 1508 is also coupled bi-directionally to CPU 1502 and provides additional data storage capacity and may include any of the computer-readable media described above. The mass storage device 1508 may be used to store programs, data and the like and is typically a secondary storage medium such as a hard disk that is slower than primary storage. It will be appreciated that the information retained within the mass storage device 1508, may, in appropriate cases, be incorporated in standard fashion as part of primary storage 1506 as virtual memory. A specific mass storage device such as a CD-ROM may also pass data uni-directionally to the CPU.

CPU 1502 is also coupled to an interface 1510 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1502 optionally may be coupled to a computer or telecommunications network using a network connection as shown generally at 1512. With such a network connection, it is contemplated that the CPU might receive information from the network, or might output information to the network in the course of performing the above-described method steps. The above-described devices and materials will be familiar to those of skill in the computer hardware and software arts.

The hardware elements described above may be configured (usually temporarily) to act as multiple software modules for performing the operations of this invention. For example, instructions for running a compiler may be stored on mass storage device 1508 and executed on CPU 1508 in conjunction with primary memory 1506.

Figure 16:
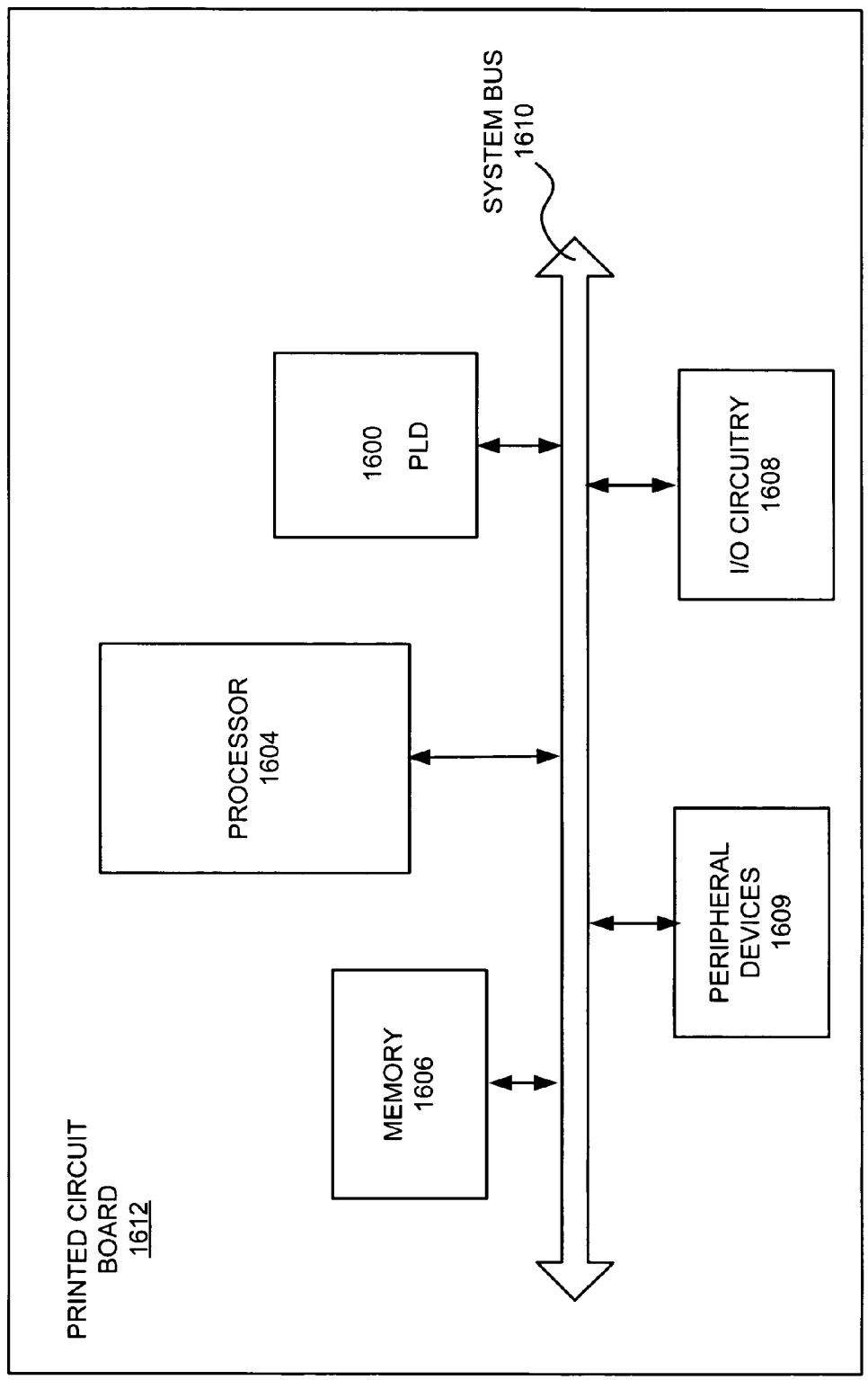
FIG. 16 illustrates a PLD of the present invention in a data processing system.

This invention also relates to programmable logic devices programmed with a design prepared in accordance with the above described methods. The invention further relates to systems employing such programmable logic devices. FIG. 16 illustrates a PLD 1600 of the present invention in a data processing system. The data processing system may include one or more of the following components: a processor 1604; memory 1606; I/O circuitry 1608; and peripheral devices 1609. These components are coupled together by a system bus 1610 and are populated on a circuit board 1612.

The system 1602 can be used in a wide variety of applications, such as computer networking, data networking, instrumentation, video processing, digital signal processing, or any other application where the advantage of using reprogrammable logic is desirable. The PLD 1600 can be used to perform a variety of different logic functions. For example, PLD 1600 can be configured as a processor or controller that works in cooperation with processor 1604. The PLD 1600 may also be used as an arbiter for arbitrating access to a shared resource in the system 1602. In yet another example, the PLD 1600 can be configured as an interface between the processor 1604 and one of the other components in the system 1602. It should be noted that the system 1602 is only exemplary.

Figure 17:
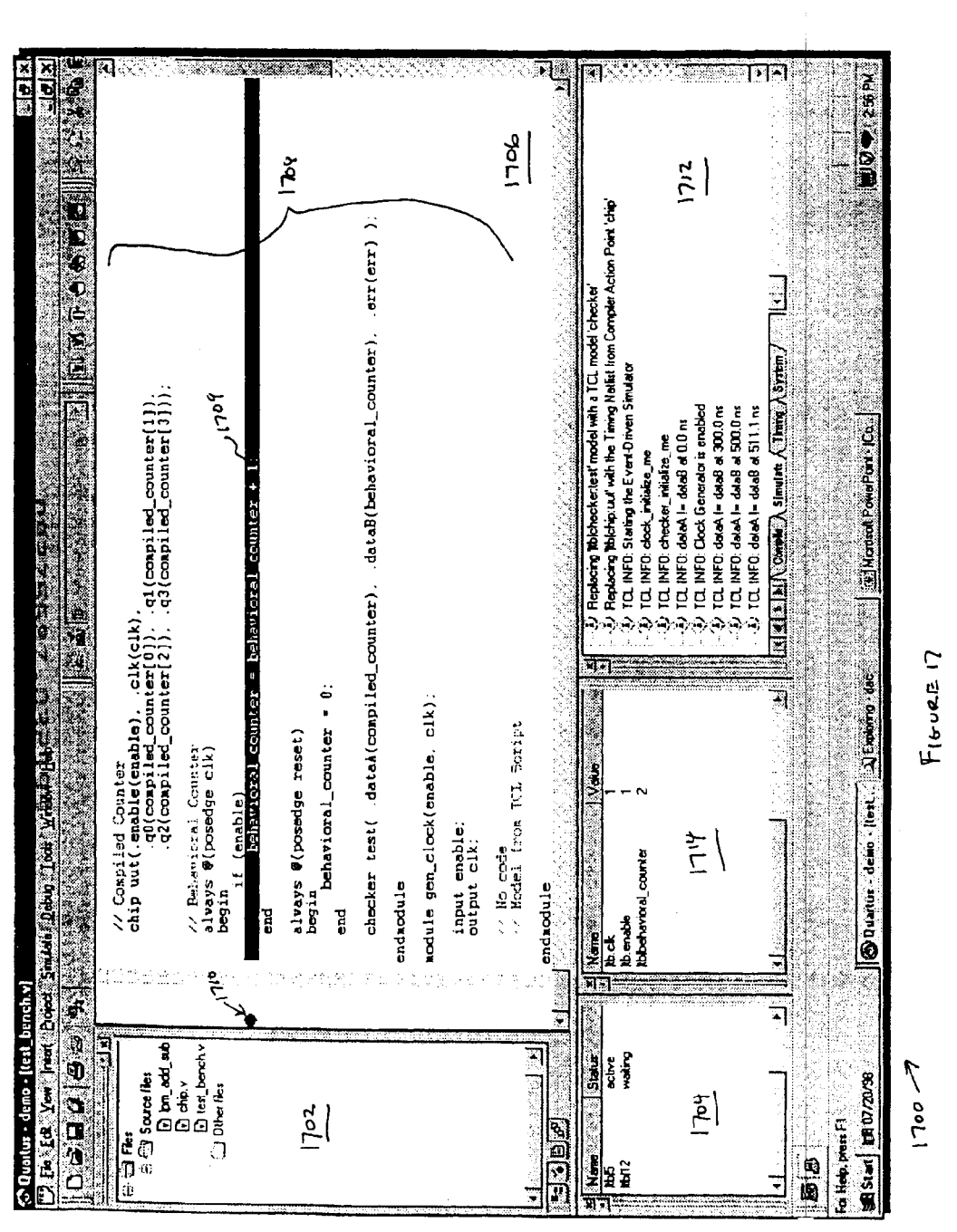

A user interface is the link between the simulation software and the end-user. Graphical user interfaces utilize graphical images to represent real world objects. A graphical user interface (GUI) 1700 in accordance with an embodiment of the invention is shown in FIG. 17. It should be noted that the GUI 1700 is one implementation of the GUI 514 shown in FIG. 5A. In the described embodiment, the GUI 1700 is displayed on the monitor 512 connected to the simulator 510. In this way, the simulator 510 is capable of displaying a variety of user selected simulation data in any number of windows provided by the GUI 1700. By way of example, an input data window 1702 is arranged to display the file names of data input at the schematic editor 502. Such data can be, for example, Verilog or VHDL input data used to characterize a particular digital circuit to be simulated or in some cases can be selected portions of a digital circuit. In one embodiment, a process block window 1704 is used to display selected process blocks that are being simulated by the simulator 510 and their respective states. By way of example, a process block "tb5" is listed as "active" meaning that it is currently being actively simulated by the simulator 510. On the other hand, a process block "tb12" is "waiting" (or suspended) until either a predetermined event occurs or a specified time limit expires. Other process block states include initialized (at beginning of simulation run) and finished (at end of simulation run). It should be noted, that the number and type of process blocks being displayed is at the discretion of the end-user.

In conjunction with the process block window 1704, a process statement window 1706 is used to display the sequential (or process) statements included within the process blocks that are denoted as active in the process blocks window 1704. By way of example, a group of process statements 1708 represent a process conditional included in the process block "tb5". A particular process statement 1709 has been highlighted by the simulator 510 to indicate that the simulator 510 has paused on the process statement 1709 based upon a corresponding control node providing, therefor, what is referred to as a break point. In one embodiment, a break point flag 1710 indicates to the end-user the particular process statement associated with the break point. In the described embodiment, the break point represented by the break point flag 1710 can be held as long as deemed appropriate by the end-user. In this way, the simulation of the digital circuit is carried out in a non-atomic fashion such that the simulation of a digital circuit can be paused at any process statement included within any process block. Additional windows include a debug window 1712 used, in some embodiments to provide a simulation debug capability and a variables window 1714 used to display particular variables associated with the paused process statement flagged by the break point flag 1710.

The foregoing describes the instant invention and its presently preferred embodiments. Numerous modifications and variations in the practice of this invention are expected to occur to those skilled in the art. For instance, the present invention may be used to simulate any type integrated circuit not just digital circuits. In one example, this technique would work well if one wished to simulate a hypothetical programmable logic device containing a mixture of LUTs and multiplexer-based logic elements as used in programmable logic devices manufactured by the Actel Corporation of Sunnyvale, Calif.

In addition, the technique and system of the present invention is suitable for use with a wide variety of EDA tools and methodologies for programming a device. Therefore, the described embodiments should be taken as illustrative and not restrictive, and the invention should not be limited to the details given herein but should be defined by the following claims and their full scope of equivalents.

What is claimed is:

1. A method of conducting a behavioral simulation of one or more process blocks in an electronic design, the method comprising:

receiving an assignment decision diagram (ADD) representation of the process block and including one or more control nodes for maintaining control flow through a simulator thereby creating one or more break points; and running the simulation of the assignment decision diagram representation, whereby the simulation is stopped when control nodes are encountered so that the state of the simulation is displayed to a user.

2. A method as recited in claim 1, wherein the assignment decision diagram representation comprises:

an assignment value portion representing a computation of values that are to be assigned to a storage unit of an output port, wherein the values are computed from current contents of storage units, input ports, or constants provided to the ADD;

an assignment condition portion connected as a data flow path representing the computation of a particular condition such that the end product of the condition computation is a binary value that evaluates to either TRUE or FALSE;

an assignment decision node (ADN) that selects a value from a set of input values computed by the assignment portion based upon conditions computed by the assignment condition portion; and an assignment target portion that is provided with the selected value from the corresponding ADN corresponding to a true ADN condition.

3. A method as recited in claim 1, wherein the one or more control nodes is selected from the group comprising a query control node used to represent a conditional branch in a control flow, an evaluation/assignment control node used to represent an assignment operation, a null control node used as a place holder, and a suspend control node used to suspend execution of the process block.

4. A method as recited in claim 3, wherein the suspend control node is selected from the group comprising an event type suspend control node used to suspend execution of the process block pending a pre-determined future event and a delay type suspend control node used to suspend execution of the process block for a for a specific length of time.

5. A method as recited in claim 4, wherein the one or more control nodes includes a control node pointer that is used to point to the portion of the assignment decision diagram representation being simulated.

6. A method as recited in claim 5, wherein the running a simulation of the assignment decision diagram representation comprises:
   simulating a first portion of the assignment decision diagram that is associated with a first control node, the first control node having a first control node pointer that points to the first portion of the assignment decision diagram during simulation; and
   simulating a second portion of the assignment decision diagram that is associated with a second control node that is different from the first control node, the second control node having a second control node pointer that points to the second portion of the assignment decision diagram during simulation, wherein the simulator traverses the control nodes associated with the assignment decision diagram representation starting at the first control node and ending at a last control node representing the end of the assignment decision diagram representation.

7. A method as recited in claim 6, wherein one or more break points are created by stopping the simulation at a selected control node[s] such that the simulation is paused at those portions of the assignment decision diagram representation corresponding to the paused control nodes.

8. A behavioral simulator for conducting a behavioral simulation of one or more process blocks in an electronic design, the behavioral simulator comprising:
   one or more processors;
   memory coupled to at least one of the one or more processors; and
   a display coupled to at least one of the one or more processors to display simulation results, wherein the one or more processors are configured or designed to run a simulation of an assignment decision representation of the one or more process blocks and stop the simulation when encountering control nodes in the assignment decision representation so that the state of the simulation can be observed.

9. A behavioral simulator as recited in claim 8, wherein the display comprises:
   an input data portion arranged to display selected input data representing the one or more process blocks in the electronic design;
   a process block status portion arranged to display a status of selected process blocks;
   a process block portion arranged to display process statements included in the process block being simulated; and
   a process block variable portion arranged to display those variables to be viewed while the simulation of the process block is paused.

10. A behavioral simulator as recited in claim 9, wherein the process block portion comprises:
    one or more process statements;
    a process statement highlighter used to highlight the process statement being simulated; and
    a process statement flag used to indicate the process statement being paused.

11. A behavioral simulator as recited in claim 10, wherein the variables viewed in the process block variable portion are associated with the paused process statement.

12. A behavioral simulator as recited in claim 11, wherein the display is a graphical user interface.

* * * * *